(12) United States Patent
Mitamura

(10) Patent No.: US 9,882,035 B2
(45) Date of Patent: Jan. 30, 2018

(54) TRENCH INSULATED GATE BIPOLAR TRANSISTOR AND MANUFACTURING METHOD THEREOF

(71) Applicant: FUJI ELECTRIC CO., LTD., Kawasaki-shi (JP)

(72) Inventor: Naoki Mitamura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/817,095

(22) Filed: Aug. 3, 2015

(65) Prior Publication Data

US 2016/0079402 A1   Mar. 17, 2016

(30) Foreign Application Priority Data

Sep. 17, 2014   (JP) ................................. 2014-189240

(51) Int. Cl.
| | |
|---|---|
| *H01L 29/739* | (2006.01) |
| *H01L 29/66* | (2006.01) |
| *H01L 29/06* | (2006.01) |
| *H01L 29/10* | (2006.01) |
| *H01L 29/40* | (2006.01) |

(52) U.S. Cl.
CPC ...... *H01L 29/7397* (2013.01); *H01L 29/0649* (2013.01); *H01L 29/0696* (2013.01); *H01L 29/1095* (2013.01); *H01L 29/66348* (2013.01); *H01L 29/402* (2013.01)

(58) Field of Classification Search
CPC ............. H01L 29/7393; H01L 29/7395; H01L 29/7397
See application file for complete search history.

(56) References Cited

U.S. PATENT DOCUMENTS

| | | | |
|---|---|---|---|
| 6,380,586 B1 | 4/2002 | Yoshikawa | |
| 2005/0173758 A1* | 8/2005 | Peake | H01L 23/49562 257/330 |
| 2006/0163649 A1 | 7/2006 | Otsuki | |
| 2010/0052044 A1* | 3/2010 | Hirler | H01L 29/7813 257/328 |

FOREIGN PATENT DOCUMENTS

| | | |
|---|---|---|
| JP | 2000-228519 A | 8/2000 |
| JP | 4857566 B2 | 1/2012 |

OTHER PUBLICATIONS

Yamaguchi, Masakazu et al. "IEGT Design Criterion for Reducing EMI Noise", Proceedings of 2004 International Symposium on Power Semiconductor Devices and ICs (ISPSD '04), Kitakyushu, pp. 115-118, May 24-27, 2004.

* cited by examiner

*Primary Examiner* — Jae Lee
(74) *Attorney, Agent, or Firm* — Rabin & Berdo, P.C.

(57) ABSTRACT

A trench insulated gate bipolar transistor includes trenches formed in the front surface of a first conductivity type drift layer, a plurality of gate electrodes selectively provided inside the trenches, insulating blocks formed of an insulator, with which the insides of the trenches are filled, one between adjacent gate electrodes, and a second conductivity type collector region formed on a surface of the first conductivity type drift layer on the opposite side from the trenches.

5 Claims, 19 Drawing Sheets

TRENCH INSULATED GATE BIPOLAR TRANSISTOR AND MANUFACTURING METHOD THEREOF

CROSS-REFERENCE TO RELATED APPLICATION

This application is based on, and claims priority to, Japanese Patent Application No. 2014-189240, filed on Sep. 17, 2014, the contents of which are entirely incorporated herein by reference.

BACKGROUND OF THE INVENTION

1. Field of the Invention

The present invention relates to a semiconductor element and a method of manufacturing the semiconductor element, and particularly, relates to an insulated gate bipolar transistor used in a power conversion device and to a method of manufacturing the insulated gate bipolar transistor.

2. Description of the Background Art

Amid a progressive reduction in the power consumption of a power conversion device, there is a large expectation for a reduction in the power consumption of power devices themselves used in the power conversion device. Among the power devices, the use of an insulated gate bipolar transistor (hereafter called an IGBT), wherein a low on-voltage can be achieved by a conductivity modulation effect, and gate control is possible using voltage, has been established. In recent years, the application of a trench IGBT, wherein a trench structure is formed from the front surface of a wafer, and gate electrodes are embedded in the trench structure via an oxide film, has increased, compared with a so-called planar IGBT wherein gate electrodes are provided in the front surface of a wafer.

Various improvement methods are proposed in order to reduce the on-voltage of the trench IGBT. For example, in a trench IGBT described in JP-A-2000-228519, after p-type base regions (p-type well regions) are formed in portions of the front surface layer of an n-type drift layer, the area ratio of the p-type base regions in contact with an emitter electrode is reduced on the emitter electrode side. Therefore, an outflow of holes injected from a p-type collector layer to the emitter electrode via the p-type base regions is suppressed, thus promoting the accumulation of holes in the front surface layer of the n-type drift layer. Further, the accumulation carrier concentration on the emitter electrode side is increased, thereby enhancing the conductivity modulation effect, and reducing the on-voltage.

However, in the case of the IGBT of JP-A-2000-228519, when holes flowing by turning on are accumulated in a region of the front surface layer of the n-type drift layer, in which no p-type base region is formed, there occurs a phenomenon wherein a displacement current flows to the gate electrodes due to the accumulated holes. As a result of this, there is the problem that a gate voltage rises sharply when turning on, and that the peak value of a collector current jumps with the sharp rise in the gate voltage.

SUMMARY OF THE INVENTION

The invention, having been contrived focusing attention on the heretofore described problem, has for its object to provide a trench insulated gate bipolar transistor, wherein it is possible to suppress a jump of the peak value of a collector current when the trench insulated gate bipolar transistor is turned on, and a method of manufacturing the trench insulated gate bipolar transistor.

In order to achieve the object, the gist of the invention is that one aspect of an insulated gate bipolar transistor according to the invention includes trenches formed in the front surface of a first conductivity type drift layer; a plurality of gate electrodes selectively provided inside the trenches; insulating blocks formed of an insulator, with which the insides of the trenches are filled, one between adjacent gate electrodes; and a second conductivity type collector region formed on a surface of the first conductivity type drift layer on the opposite side from the trenches.

Also, the gist of the invention is that one aspect of an insulated gate bipolar transistor manufacturing method includes a step of filling the insides of trenches, formed in portions of the front surface layer of a semiconductor region, with an insulator; a step of removing portions of the insulator filling the trenches and selectively exposing the insides of the trenches; and a step of forming gate electrodes in the selectively exposed insides of the trenches.

Consequently, according to the insulated gate bipolar transistor according to the invention, it is possible to suppress a jump of the peak value of a collector current when turning on.

DETAILED DESCRIPTION OF THE INVENTION

Figure 1:
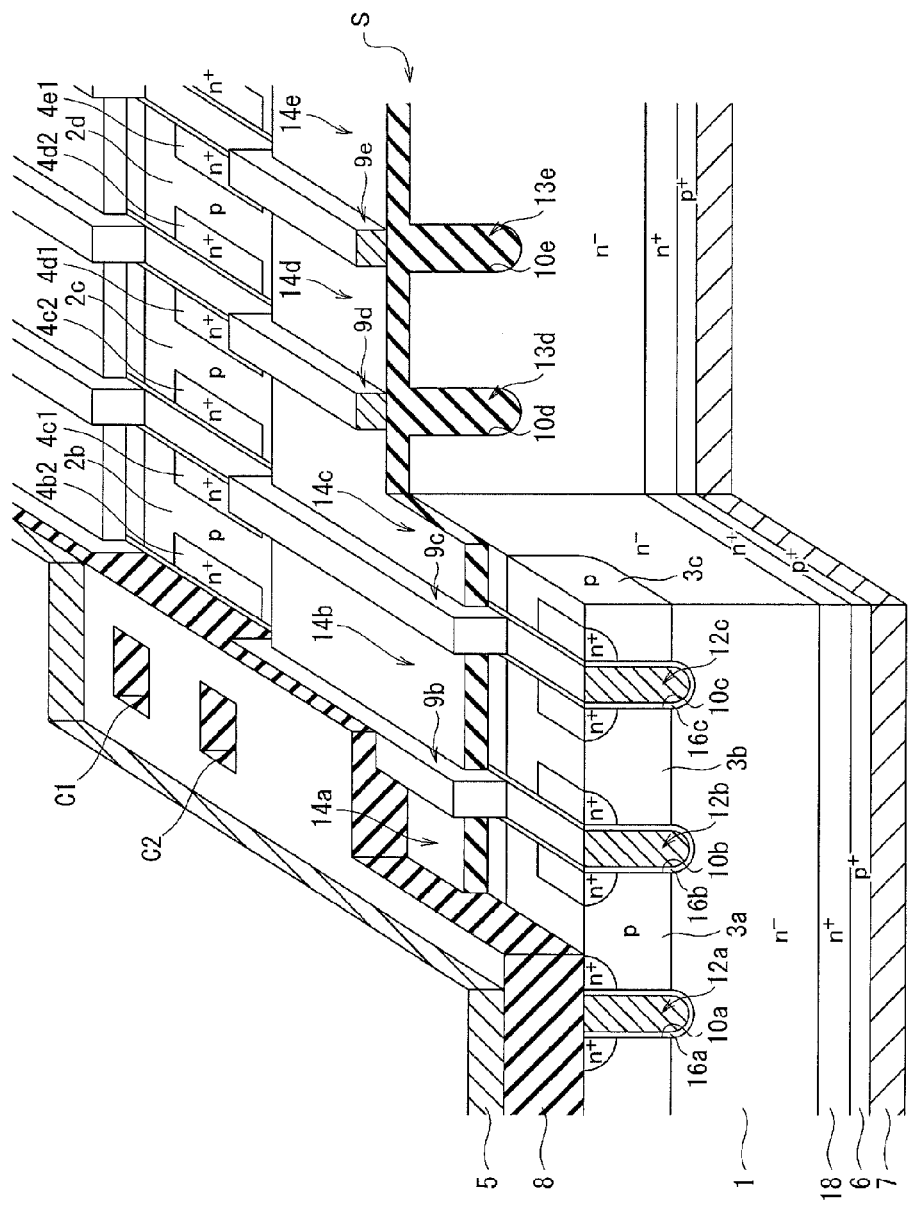
FIG. 1 is a sectional view schematically illustrating an IGBT according to an embodiment of the invention.

Hereafter, a description will be given of an embodiment of the invention. In the following description of the drawings, identical or like portions are given identical or like signs. However, the drawings are schematic, and it should be noted that the relation between the thicknesses and the dimensions in plan view, the thickness ratios of layers or wirings, and the like, are different from the real ones. Consequently, specific thicknesses and dimensions should be determined making allowance for the following description. Also, it goes without saying that even in the drawings, one drawing includes portions different in the relation and ratio of dimensions from those of another. Also, the "left-right" and "up-down" directions in the following description, being defined simply for the purpose of illustration, do not limit the technical idea of the invention. Therefore, it is natural that "left-right" and "up-down" are read interchanged when the plane of the drawing is turned, for example, 90 degrees, and that "left" becomes "right" and "right" becomes "left" when the plane of the drawing is turned, for example, 180 degrees.

Also, in the following description of the embodiment of the invention, an illustrative description will be given of the case in which a first conductivity type is n-type and a second conductivity type is p-type, but by selecting the conductivity types in inverse relation, the first conductivity type may be p-type and the second conductivity type may be n-type. In the present specification and the accompanying drawings, n or p in layers and regions prefixed with n or p means respectively that electrons or holes are majority carriers. Also, + or − suffixed to n or p means respectively that a semiconductor region is relatively high or low in impurity concentration compared with a semiconductor region affixed with no + or −. Also, in the accompanying drawings, the hatched illustration of some layers is omitted for ease of visualization.

Structure of IGBT

Figure 2:
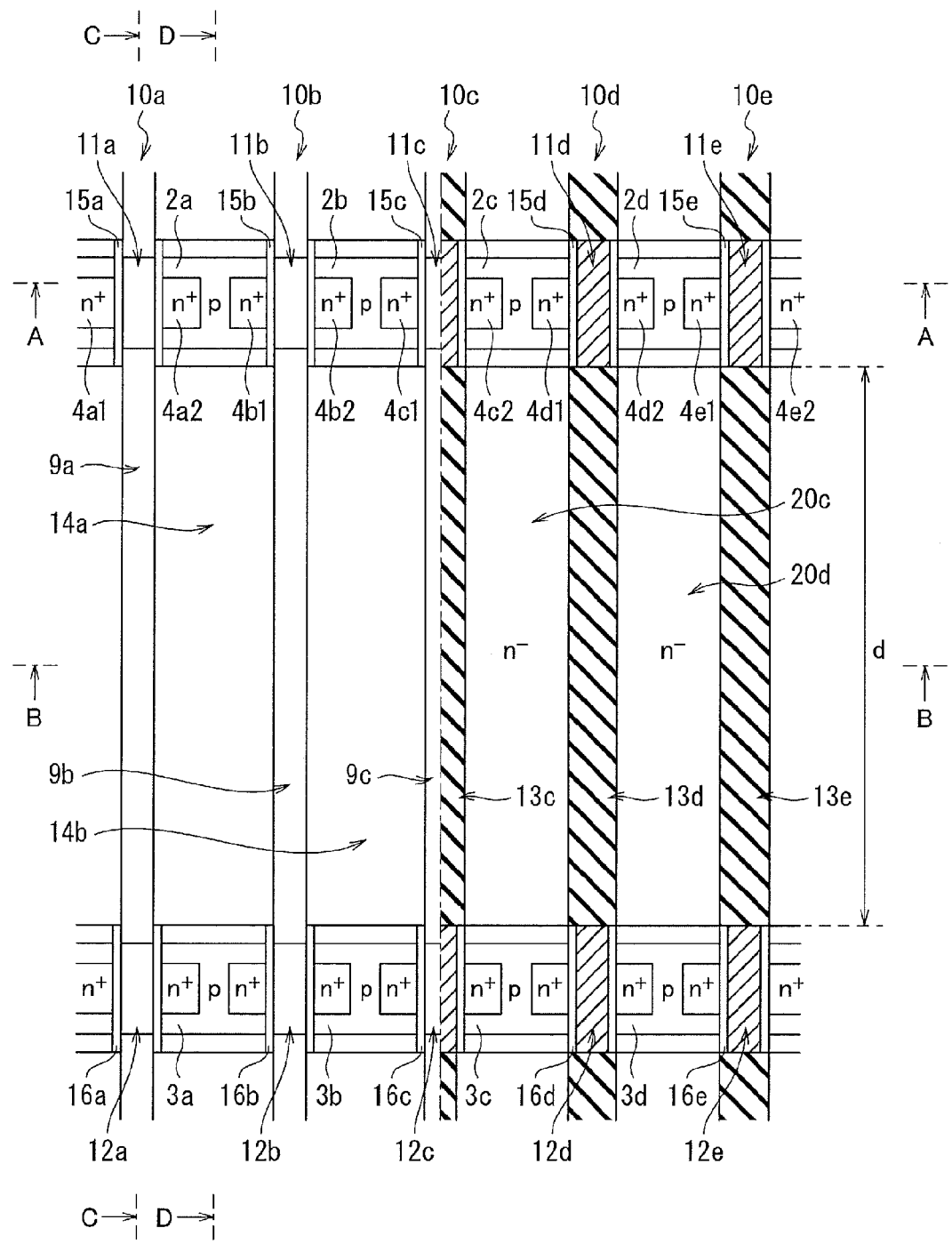
FIG. 2 is a plan view schematically illustrating the IGBT according to the embodiment of the invention.

A trench insulated gate bipolar transistor (IGBT) according to the embodiment of the invention includes a plurality of second conductivity type base regions 2a, 2b, . . . 2d, . . . and 3a, 3b, . . . 3d, . . . , formed in portions of the front surface layer of a first conductivity type drift layer 1, and a plurality of first conductivity type emitter regions 4a1, 4a2, 4b1, . . . 4e2, . . . formed in the corresponding inner portions of the second conductivity type base regions 2a, 2b, . . . 2d, and 3a, 3b, . . . 3d, . . . , as shown in FIGS. 1 and 2.

Also, the IGBT includes a plurality of trenches 10a, 10b, . . . 10e, . . . , formed from the front surface of the plurality of first conductivity type emitter regions 4a1, 4a2, 4b1, . . . 4e2, . . . to the first conductivity type drift layer 1, and a plurality of gate electrodes 11a, 11b, . . . 11e, . . . and 12a, 12b, . . . 12e, . . . selectively provided inside the plurality of trenches 10a, 10b, . . . 10e, . . . so as to be opposite the plurality of second conductivity type base regions 2a, 2b, . . . 2d, . . . and 3a, 3b, . . . , 3d, . . . via respective insulating films 15a, 15b, . . . 15e, . . . and 16a, 16b, . . . 16e, . . . .

Figure 3:
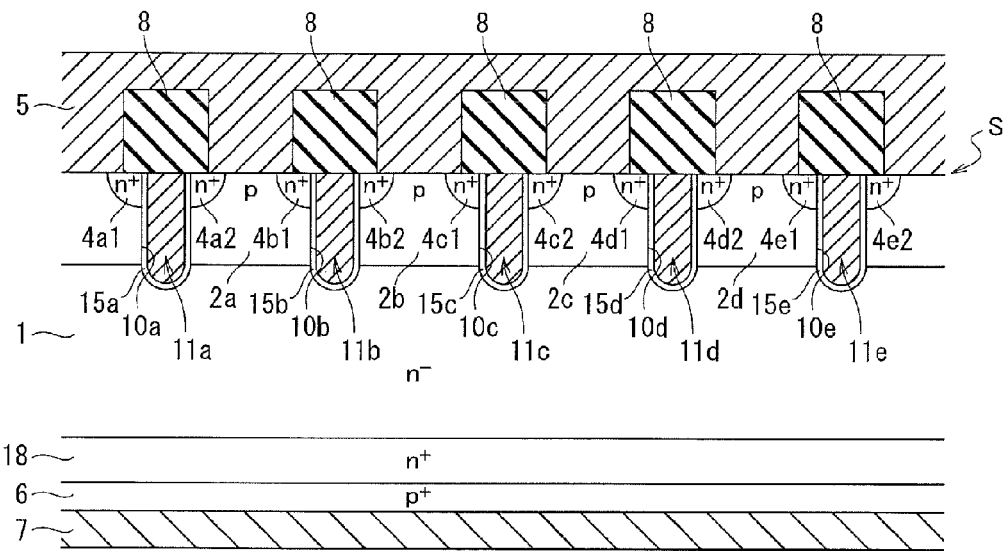
FIG. 3 is a sectional view seen from the A-A direction in FIG. 2.

Also, the IGBT includes a plurality of insulating blocks 13a, 13b, . . . 13e, . . . formed in regions, in spaces on the respective insides of the trenches 10a, 10b, . . . 10e, . . . , other than the regions in which are provided the gate electrodes 11a, 11b, . . . 11e, . . . and 12a, 12b, . . . 12e, . . . , as shown in FIGS. 2 and 3. Also, the IGBT includes, on the insulating blocks 13a, 13b, . . . 13e, . . . , a plurality of gate link portions 9a, 9b, . . . 9e, . . . each of which electrically connects adjacent gate electrodes 11a, 11b, . . . 11e, . . . and 12a, 12b, . . . 12e, . . . . Also, the IGBT includes a plurality of interwall layers 14a, 14b, . . . 14e, formed on regions, of the front surface layer of the first conductivity type drift layer 1, with which the insulating blocks 13a, 13b, . . . 13e, . . . are in contact. Also, the IGBT includes an insulating layer 8 stacked in common on the front surface of the first conductivity type drift layer 1, on the interwall layers 14a, 14b, . . . 14e, . . . , and on the gate link portions 9a, 9b, . . . 9e, . . . .

Also, the IGBT includes, on the insulating layer 8, an emitter electrode 5, provided in common contact with the front surfaces of the first conductivity type emitter regions 4a1, 4a2, 4b1, . . . 4e2, . . . and with the front surfaces of the second conductivity type base regions 2a, 2b, . . . 2d, . . . and 3a, 3b, . . . 3d, . . . , and a first conductivity type buffer layer 18 formed on a surface of the first conductivity type drift layer 1 on the opposite side from the second conductivity type 2a, 2b, . . . 2d, . . . and 3a, 3b, . . . 3d, . . . . The emitter electrode 5 is in contact with the front surfaces of the second conductivity type base regions 2a, 2b, . . . 2d, . . . and 3a, 3b, . . . 3d, . . . via a plurality of contact holes C1, C2, . . . formed in the insulating layer 8.

Also, the IGBT includes a second conductivity type collector region 6, formed on a surface of the first conductivity type buffer layer 18 on the opposite side from the trenches 10a, 10b, . . . 10e, . . . , and a collector electrode 7 provided on a surface of the second conductivity type collector region 6 on the opposite side from the first conductivity type buffer layer 18. In FIG. 1, one portion of each layer and electrode of the IGBT is sectioned, and an illustration is omitted, for the purpose of illustration.

Each of the second conductivity type base regions 2a, 2b, . . . 2d, . . . and 3a, 3b, . . . 3d, . . . is provided between adjacent trenches 10a, 10b, . . . 10e, . . . , as shown in FIG. 2. The second conductivity type base regions 2a, 2b, . . . 2d, . . . and 3a, 3b, . . . 3d, . . . are linearly aligned perpendicular to the direction of extension of the trenches, in the left-right direction in FIG. 2, via the trenches 10a, 10b, . . . 10e, . . . , with the IGBT viewed in plan. Also, the linearly presented second conductivity type base regions are such that as shown in FIG. 2 by the upper side group of second conductivity type base regions 2a, 2b, . . . 2d, . . . and the lower side group of second conductivity type base regions 3a, 3b, . . . 3d, . . . , the upper and lower side groups of second conductivity type base regions are parallel to each other spaced from one another in the direction of extension of the trenches. The plurality of second conductivity type base regions 2a, 2b, . . . 2d, . . . and 3a, 3b, . . . 3d, . . . are disposed so as to represent a striped pattern over all.

In FIG. 2, the condition in which the insulating layer 8 and the emitter electrode 5 are removed is schematically illustrated in the region on the left side of the chain line shown in the center in the left-right direction. Also, the condition of a horizontal section in a position on an upper surface S (refer to FIG. 1) of the first conductivity type drift layer 1 is shown in a plan view in the region on the right side of the chain line.

The trenches 10a, 10b, . . . 10e, . . . , all having a U-shape and the same trench width, are formed, parallel to each other at equally spaced intervals, on the first conductivity type drift layer 1, and are in contact with the second conductivity type base regions 2a, 2b, . . . 2d, . . . and 3a, 3b, . . . 3d, . . . . The shape of the trenches, not being limited to a U-shape, may be formed in another shape such as a V-shape.

The gate electrodes 11a, 11b, . . . 11e, . . . and 12a, 12b, . . . 12e, . . . may be of a material having conductive properties, for which polycrystalline silicon in which conductive impurities are doped (doped polysilicon) is used in the embodiment of the invention. The gate electrodes 11a, 11b, . . . 11e, . . . and 12a, 12b, . . . 12e, . . . are selectively embedded inside the trench 10a, as exemplified by two gate electrodes 11a and 12a in FIG. 5, and are arranged in parallel, spaced a predetermined distance d apart, in the direction of extension of the trench 10a. That is, the gate electrodes 11a, 11b, . . . 11e, . . . and 12a, 12b, . . . 12e, . . . are disposed separated from one another inside the trench. Therefore, the total area of two regions, in each of which one separated gate electrode is in contact with the first conductivity type drift layer 1 via respective insulating films, is smaller than the area of a region of a gate electrode in contact with the first conductivity type drift layer 1 via respective insulating films when the gate electrode is uniformly embedded all over inside one trench (refer to FIG. 8).

The gate link portions 9a, 9b, . . . 9d, . . . may be of a material having conductive properties, for which doped polysilicon is used in the same way as in the gate electrodes 11a, 11b, . . . 11e, . . . and 12a, 12b, . . . 12e, . . . . As the material of the gate link portions 9a, 9b, . . . 9d, . . . , without being limited to doped polysilicon, another conductive material may be used as long as it functions as a wiring which electrically connects the gate electrodes together. The gate link portions 9a, 9b, . . . 9d, . . . are formed in a quadrate column shape, as shown in FIG. 1, and the width (the length in the left-right direction in FIG. 1) of the gate link portions 9a, 9b, . . . 9d, . . . is substantially the same as the width of the gate electrodes 11a, 11b, . . . 11e, . . . and 12a, 12b, . . . 12e, . . . .

Figure 5:
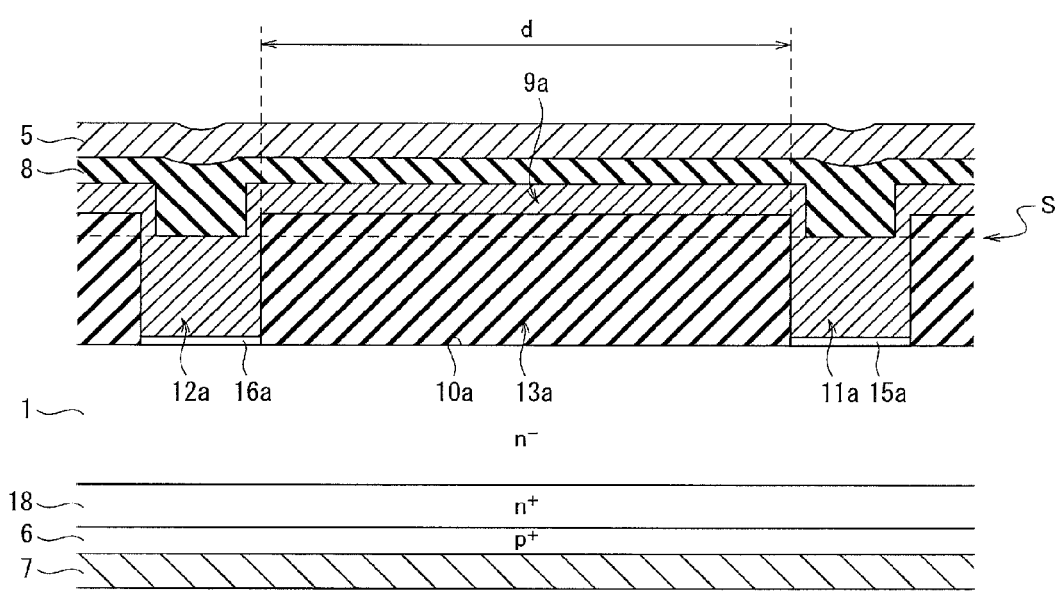
FIG. 5 is a sectional view seen from the C-C direction in FIG. 2.

The gate link portions 9a, 9b, . . . 9d, . . . are such that as exemplified by the gate link portion 9a in FIG. 5, the central portion in the longitudinal direction of the gate link portion 9a is stacked on the upper surface of the insulating block 13a, and the two end portions of the gate link portion 9a are connected one to each of the adjacent gate electrode 11a and gate electrode 12a. That is, the gate link portion 9a is provided so as to extend over the insulating block 13a and bridge between the adjacent gate electrode 11a and gate electrode 12a. The lower surfaces of the two end portions of the gate link portion 9a are joined to the upper surfaces of the respective gate link portion 9a side end portions of the gate electrode 11a and gate electrode 12a. That is, the upper surfaces of the gate electrode 11a and gate electrode 12a are lower in level than the upper surface of the gate link portion 9a, and a level difference is formed between the two upper surfaces of the gate electrode 11a and gate electrode 12a and the upper surface of the gate link portion 9a. By the gate link portions 9a, 9b, . . . 9d, . . . being each provided so as to bridge between adjacent gate electrodes, it is possible to electrically connect the gate electrodes together even in a condition in which the interwall layers 14a, 14b, . . . 14d, . . . are stacked on the front surface of the first conductivity type drift layer 1.

Figure 4:
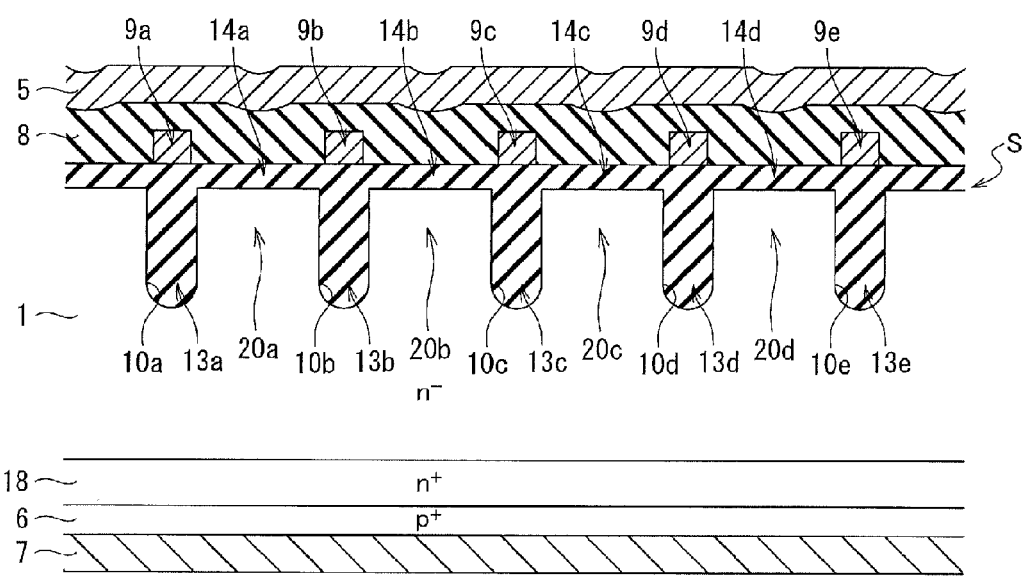
FIG. 4 is a sectional view seen from the B-B direction in FIG. 2.

Herein, regions of the front surface layer of the first conductivity type drift layer 1 in which is formed no second conductivity type base region are defined as "carrier accumulation regions". FIGS. 2 and 4 show a plurality of carrier accumulation regions 20a, 20b, . . . 20d, . . . in the front surface layer of the first conductivity type drift layer 1. Holes flowing in from the second conductivity type collector region 6 when the IGBT is turned on are accumulated in the carrier accumulation regions 20a, 20b, . . . 20d, . . . .

The insulating blocks 13a, 13b, . . . 13d, . . . are formed by an insulator formed of oxide filling the spaces inside the trenches 10a, 10b, . . . 10e, . . . in contact with the carrier accumulation regions 20a, 20b, . . . 20d, . . . , as shown in FIG. 4, and are a longitudinally long wall-like structure having a longitudinal direction in the direction of extension of the trenches 10a, 10b, . . . 10e, . . . . The lower end portions of the insulating blocks 13a, 13b, . . . 13d, . . . reach below the second conductivity type base regions 2a, 2b, . . . 2d, . . . and 3a, 3b, . . . 3d, . . . .

The two end portions of each of the insulating blocks 13a, 13b, . . . 13d, . . . are formed so as not to overlap with the second conductivity type base regions 2a, 2b, . . . 2d, . . . and 3a, 3b, . . . 3d, . . . , as shown in FIG. 2. It is not excluded that the two end portions of each of the insulating blocks 13a, 13b, . . . 13d, . . . overlap with the second conductivity type base regions 2a, 2b, . . . 2d, . . . and 3a, 3b, . . . 3d, . . . , but it is preferable that the two end portions of each of the insulating blocks 13a, 13b, . . . 13d, . . . are formed so as not to overlap with at least the first conductivity type emitter regions 4a1, 4a2, 4b1, . . . 4e2, . . . . This is because when the two end portions of each of the insulating blocks 13a, 13b, . . . 13d, . . . overlap with the first conductivity type emitter regions 4a1, 4a2, 4b1, . . . 4e2, . . . the area of regions of the gate electrodes 11a, 11b, . . . 11e, . . . and 12a, 12b, . . . 12e, . . . in contact with the first conductivity type emitter regions 4a1, 4a2, 4b1, . . . 4e2 via respective insulating films, . . . decreases, thus affecting a channel formation. A displacement current flowing to the gate electrodes 11a, 11b, . . . 11e, . . . and 12a, 12b, . . . 12e, . . . due to the holes accumulated in the carrier accumulation regions 20a to 20d, . . . is suppressed by the insulating blocks 13a, 13b, . . . 13d, . . . , and it is thus possible to suppress a sharp rise in the gate voltage of the IGBT.

As shown in FIG. 5, the length in the lateral direction of the insulating block 13a is equal to the distance d between the adjacent gate electrode 11a and gate electrode 12a. Therefore, when the area of a portion on the principal surface of a semiconductor substrate in which to form an IGBT element is set to be constant, the longer the distance d is set to be, the volume occupied by the insulating blocks 13a, 13b, . . . 13d, . . . increases, thus suppressing the displacement current flowing to the gate electrodes 11a, 11b, . . . 11e, . . . and 12a, 12b, . . . 12e, . . . , and suppressing a rise in the gate voltage when turning on.

Meanwhile, when the distance d increases, the volume of the gate electrodes 11a, 11b, . . . 11e, . . . and 12a, 12b, . . . 12e, . . . decreases in inverse proportion to an increase in the volume of the insulating blocks 13a, 13b, ... 13d, ..., and the length of the gate link portions 9a, 9b, ... 9d, ... linking the gate electrodes increases. Therefore, when the gate link portions 9a, 9b, ... 9d, ... cannot be increased in thickness, the gate resistance of the whole of the IGBT increases, thus leading to a rise in the gate voltage when turning on. That is, the distance d is set taking into account the balance between the suppression of the displacement current flowing to the gate electrodes 11a, 11b, ... 11e, ... and 12a, 12b, ... 12e, ... and an increase in the gate resistance of the IGBT.

Figure 6:
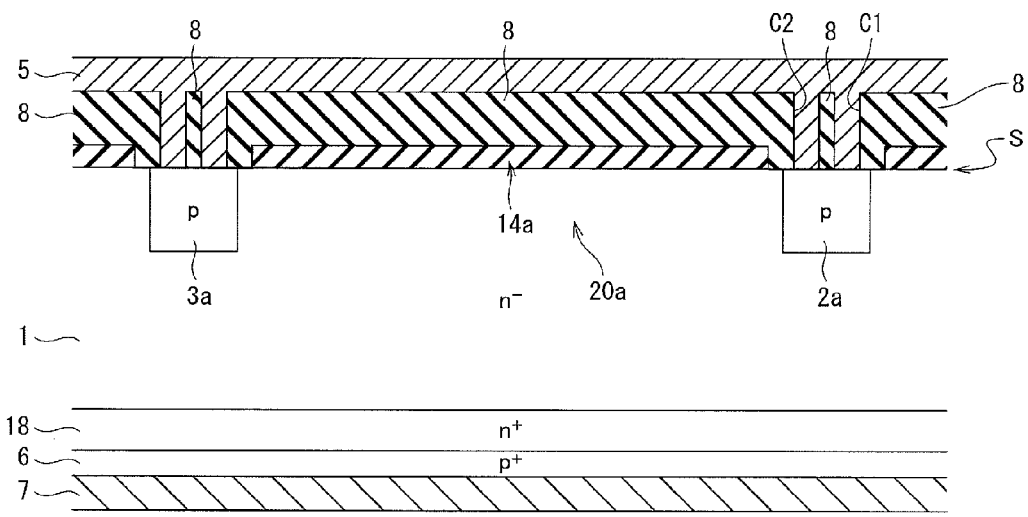
FIG. 6 is a sectional view seen from the D-D direction in FIG. 2.

The interwall layers 14a, 14b, ... 14d, ... are regions each configured of an insulator positioned between adjacent insulating blocks 13a, 13b, ... 13d, ..., and are formed integrally with the insulating blocks 13a, 13b, ... 13d, ..., as shown in FIG. 4. The upper surfaces of the interwall layers 14a, 14b, ... 14d, ... and the upper surfaces of the insulating blocks 13a, 13b, ... 13d, ... are formed flush with each other. Also, the interwall layers 14a, 14b, ... 14d, ... are formed on the front surfaces of the carrier accumulation regions 20a, 20b, ... 20d, ..., as exemplified by the interwall layer 14a in FIG. 6. Therefore, the interwall layers 14a, 14b, ... 14d, ... show the same striped pattern as that of the second conductivity type base regions, with the IGBT viewed in plan (refer to FIG. 2).

The first conductivity type drift layer 1 is an n-type semiconductor region formed to have a low impurity concentration, that is, a comparatively high resistance. The second conductivity type base regions 2a, 2b, ... 2d, ... and 3a, 3b, ... 3d, ... are p-type semiconductor regions selectively formed on a surface layer on one side (the upper side in FIG. 3) of the first conductivity type drift layer 1. The first conductivity type emitter regions 4a1, 4a2, 4b1, ... 4e2, ... are n-type semiconductor regions selectively formed on surface layers on one side of the second conductivity type base regions 2a, 2b, ... 2d, ... and 3a, 3b, ... 3d, ..., as shown in FIGS. 2 and 3 so as to have a high impurity concentration, that is, semiconductor regions formed to have a comparatively low resistance.

The first conductivity type buffer layer 18, being an n-type semiconductor region formed to have a high impurity concentration, is provided in order to improve the trade-off characteristics between a collector voltage (saturation voltage) and turn-off loss of the IGBT. Also, the second conductivity type collector region 6 is a p-type semiconductor region formed to have a high impurity concentration, and when the IGBT is turned on, holes are injected into the first conductivity type drift layer 1 via the first conductivity type buffer layer 18 from the second conductivity type collector region 6.

Operation of IGBT

When the IGBT is turned on, as well as a forward bias being applied between the collector and the emitter, the gate voltage is applied to the gate electrodes 11a, 11b, ... 11e, ... and 12a, 12b, ... 12e, ..., thereby forming channels between the first conductivity type drift layer 1 and the first conductivity type emitter regions 4a1, 4a2, 4b1, ... 4e2, ... and a current flows between the collector and the emitter. Also, holes are injected into the first conductivity type drift layer 1 from the second conductivity type collector region 6, thereby producing a conductivity modulation effect, and the resistance of the first conductivity type drift layer 1 drops. The IGBT comes to an on-state, and the injected holes are accumulated in the plurality of carrier accumulation regions 20a, 20b, ... 20d, ....

The holes injected from the second conductivity type collector region 6 are accumulated in the carrier accumulation regions 20a, 20b, ... 20d, ..., and a turn-on voltage $V_{on}$ of the IGBT drops due to the accumulated holes. Meanwhile, as the insulating blocks 13a, 13b, ... 13d, ... are provided in contact with the carrier accumulation regions 20a, 20b, ... 20d, ..., the displacement current flowing to the gate electrodes 11a, 11b, ... 11e, ... and 12a, 12b, ... 12e, ... due to the accumulated holes is suppressed. Also, as the insulating blocks 13a, 13b, ... 13d, ... are a wall-like structure corresponding to the shape of the trenches, and the lower end portions of the insulating blocks 13a, 13b, ... 13d, ... reach below the second conductivity type base regions 2a, 2b, ... 2d, ... and 3a, 3b, ... 3d, ..., a movement of the holes in the carrier accumulation regions 20a, 20b, ... 20d, ... is effectively suppressed. Therefore, a rise in the gate voltage is suppressed, and a jump of a collector current when turning on is suppressed.

Also, when the collector current increases, a time change in the voltage of commutation diodes (FWD) of opposing arms of the IGBT increases, as a result of which electromagnetic noise increases, and the turn-on loss of the IGBT increases. Therefore, in the embodiment of the invention, a jump of the peak value of the collector current is suppressed by the plurality of insulating blocks 13a, 13b, ... 13d, ..., and it is thereby possible to reduce the turn-on loss.

Also, when the IGBT is turned off, the channels disappear, and the injection of the holes from the second conductivity type collector region 6 stops. The holes accumulated in the carrier accumulation regions 20a, 20b, ... 20d, ... vanish, paired with electrons, in the first conductivity type drift layer 1, or flow out to the emitter electrode 5 passing through the second conductivity type base regions 2a to 2d and 3a to 3d.

Figure 7:
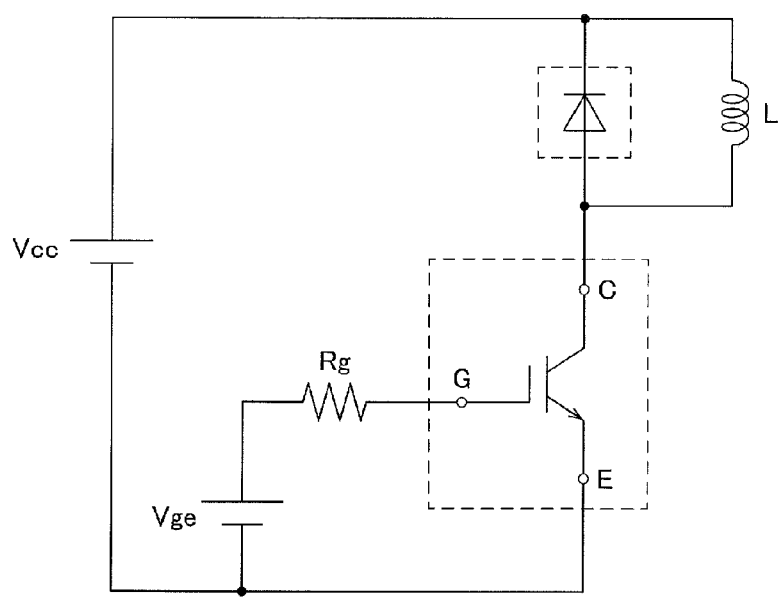
FIG. 7 is a configuration diagram of a circuit used in a simulation which analyzes the characteristics of the IGBT according to the IGBT of the invention.

Next, a description will be given of the characteristics of the IGBT according to the embodiment of the invention, as well as a comparison example, using results obtained in a simulation analysis. The values (a direct current power source voltage $V_{cc}$, an inductance L, a gate-emitter voltage $V_{ge}$, and a gate resistance $R_g$) of elements, in a circuit used in the simulation, other than the diode and IGBT shown by the dashed line boxes in FIG. 7 are set by being input from the external.

The IGBT has a rated voltage of 3.3 kV and a rated current density of about 50 A/cm². Other main dimensions are described in the following 1 to 7.

1. First Conductivity Type Drift Layer
Thickness: about 370 μm, and highest impurity concentration: on the order of about $2 \times 10^{13}$/cm³

2. Trenches
Shape: U-shape, depth: about 51 μm, opening width: about 11 μm, trench intervals: about 41 μm, and depth of inside oxide film: about 0.11 μm 3. Second Conductivity Type Base Regions
Width: about 41 μm, length: about 41 μm, depth: about 31 μm, distance between adjacent second conductivity type base regions: about 90 μm, and surface impurity concentration: on the order of $5.5 \times 10^{16}$/cm³

4. First Conductivity Type Emitter Regions
Width: about 1.5 μm, length: about 1.5 μm, depth: about 0.3 μm, and surface impurity concentration: on the order of $1.0 \times 10^{20}$/cm³

5. Insulating Blocks
Length (=distance d between gate electrodes): about 951 μm

6. First Conductivity Type Buffer Layer
Thickness: about 30 μm, and highest impurity concentration: on the order of $1.0 \times 10^{15}$/cm³

7. Second Conductivity Type Collector Region
Thickness: about 11 μm, and surface impurity concentration: on the order of $1.0 \times 10^{17}$/cm³

Figure 8:
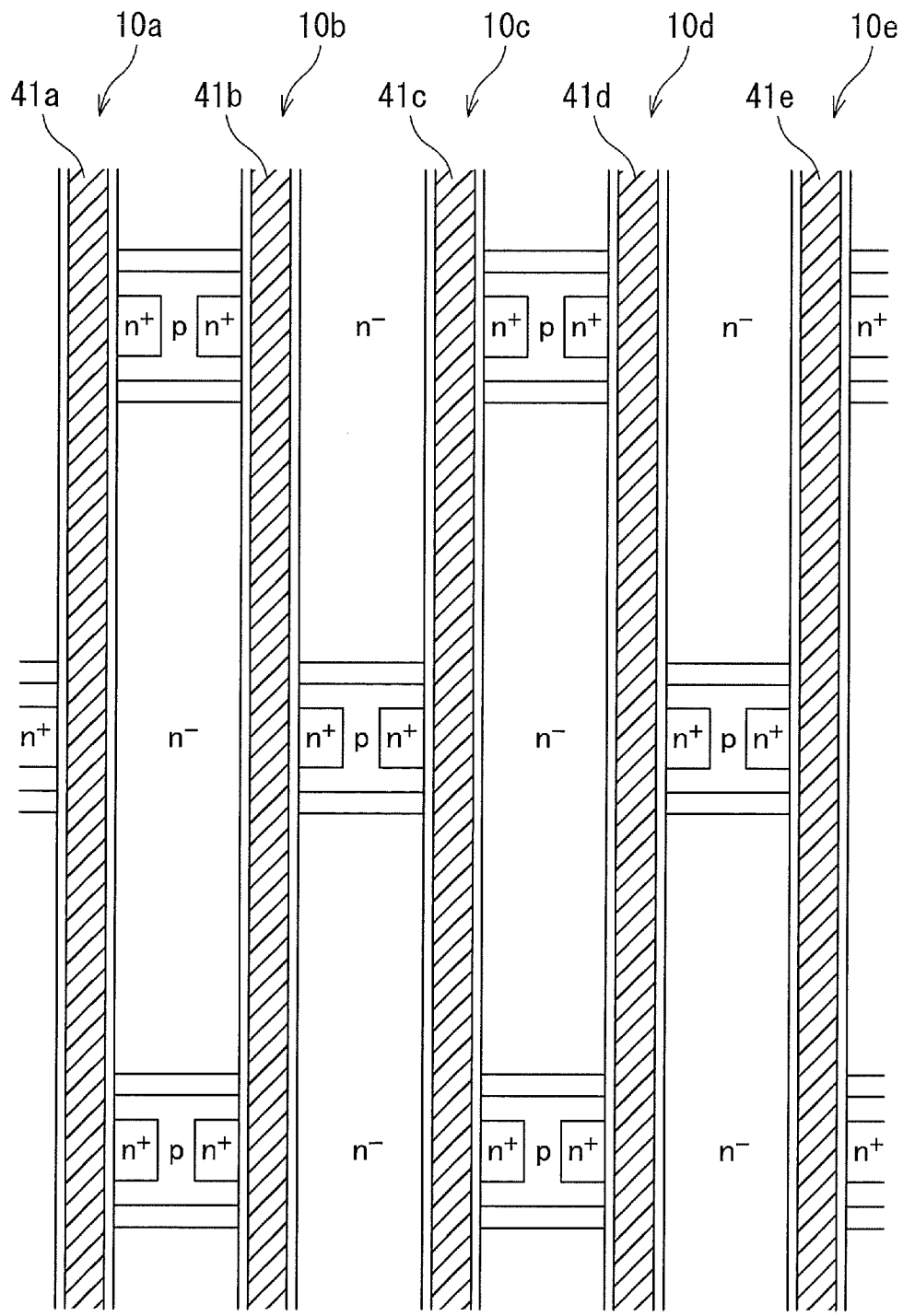
FIG. 8 is a plan view schematically illustrating an IGBT according to a comparison example.

Also, an IGBT according to the comparison example is different from in the embodiment in that a plurality of second conductivity type base regions, including first conductivity type emitter regions, which are marked with no sign, are disposed in a checkered pattern between the trenches 10a, 10b, ... 10e, ..., with the IGBT viewed in plan, as shown in FIG. 8. Also, the IGBT according to the comparison example is different from in the embodiment in that it does not have the insulating blocks according to the embodiment of the invention, and that gate electrodes 41a, 41b, ... 41e, ... are uniformly embedded all over inside the respective trenches 10a, 10b, ... 10e, ... illustrated in FIG. 8, in the direction of extension of the trenches 10a, 10b, ... 10e, ..., via the insulating films. Other dimensions of the IGBT according to the comparison example are the same as in the embodiment, and the size of the carrier accumulation regions is also the same as in the embodiment.

Figure 9:
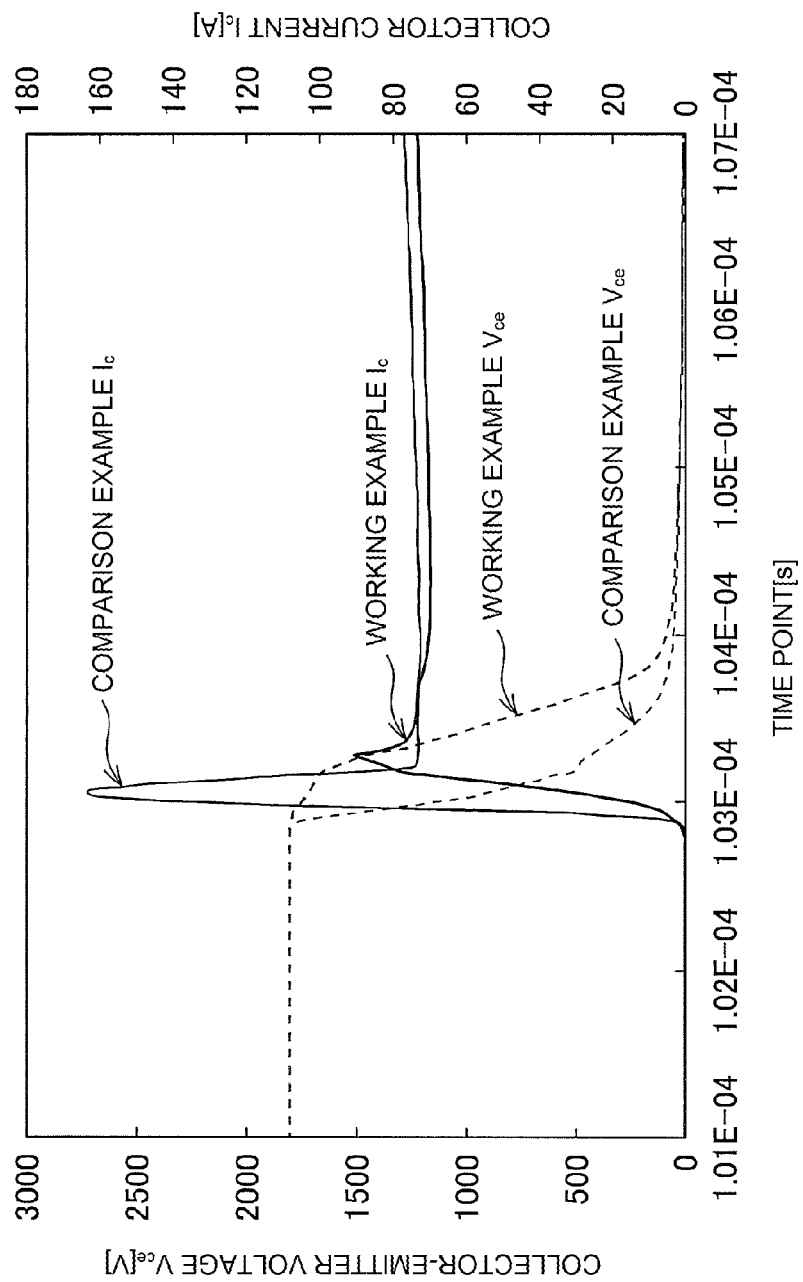
FIG. 9 is a characteristic diagram showing waveforms of a collector current and a collector-emitter voltage, when turning on, resulting from the simulation analysis.

As a result of the simulation analysis, firstly, as shown by the two solid lines in FIG. 9, the values of respective collector currents $I_c$ in the embodiment and comparison example both rise at the same time point, falls after attaining a peak, and reaches a substantially constant value. The peak value of the collector current $I_c$ in the comparison example is 160 [A] or more, while the peak value of the collector current $I_c$ in the embodiment is on the order of 90 [A].

In the case of the comparison example, after holes flowing in from the second conductivity type collector region by turning on are accumulated in the carrier accumulation regions, a displacement current flows to the gate electrodes in contact with the carrier accumulation regions, and the gate voltage rises sharply. Therefore, the collector current $I_c$ in the comparison example jumps high, as shown by the peak value.

Meanwhile, in the case of the embodiment, as there are very few gate electrodes existing in the vicinity of the carrier accumulation regions, no displacement current flows to the gate electrodes even when the holes flow into the carrier accumulation regions, and a sharp rise in the gate voltage is suppressed. Therefore, it can be confirmed that the peak value of the collector current $I_c$ in the embodiment is significantly suppressed, and that it is thus possible to suppress a jump of the collector current.

Figure 10:
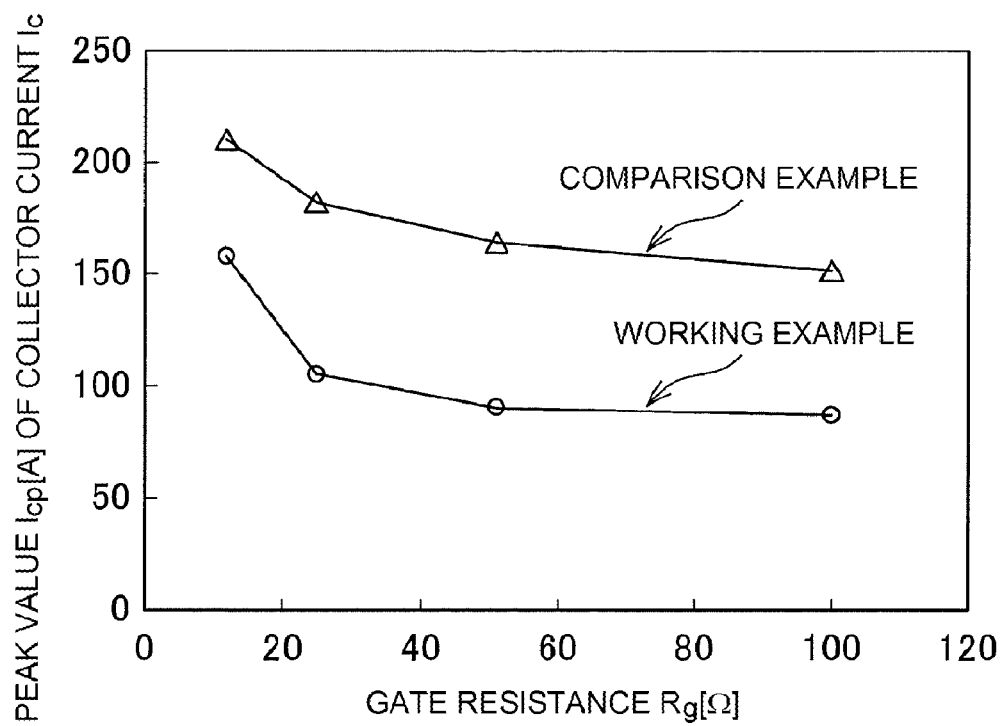
FIG. 10 is a characteristic diagram showing a relationship, between a gate resistance and the peak value of the collector current, resulting from the simulation analysis.

Also, as shown by the dashed lines in FIG. 9, a collector-emitter voltage $V_{ce}$ also changes in accordance with a change in the values of the respective collector currents $I_c$ in the embodiment and comparison example. Also, as shown in FIG. 10, even when the gate resistance $R_g$ is changed between 10 to 100(Ω), a peak value $I_{cp}$ of the collector current $I_c$ is kept lower in the embodiment than in the comparison example.

Figure 11:
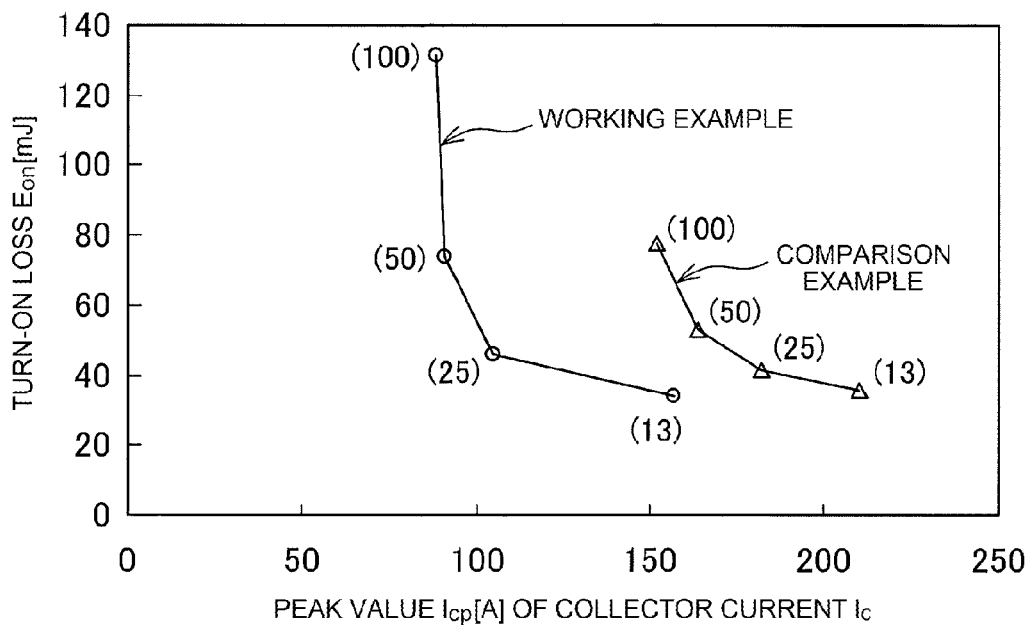
FIG. 11 is a characteristic diagram showing a correlation, between the peak value of the collector current and turn-on loss, resulting from the simulation analysis.

Also, as shown in FIG. 11, the peak value $I_{cp}$ of the collector current $I_c$ in the embodiment is kept to the order of ⅔ of the peak value $I_{cp}$ of the collector current $I_c$ in the comparison example, as compared with each other at the same value of turn-on loss $E_{on}$. Bracketed numerical values placed beside the plots in FIG. 11 are the values of the gate resistances $R_g$ when the simulation is carried out. Herein, the peak value $I_{cp}$ of the collector current $I_c$ and the turn-on loss $E_{on}$ are in a trade-off relationship. That is, it is found that the embodiment has low noise characteristics with the turn-on loss $E_{on}$ remaining kept down. Also, in the case of the same peak value $I_{cp}$=150 [A], in the embodiment of the invention, the turn-on loss $E_{on}$ decreases to about a half, compared with in the comparison example.

Figure 12:
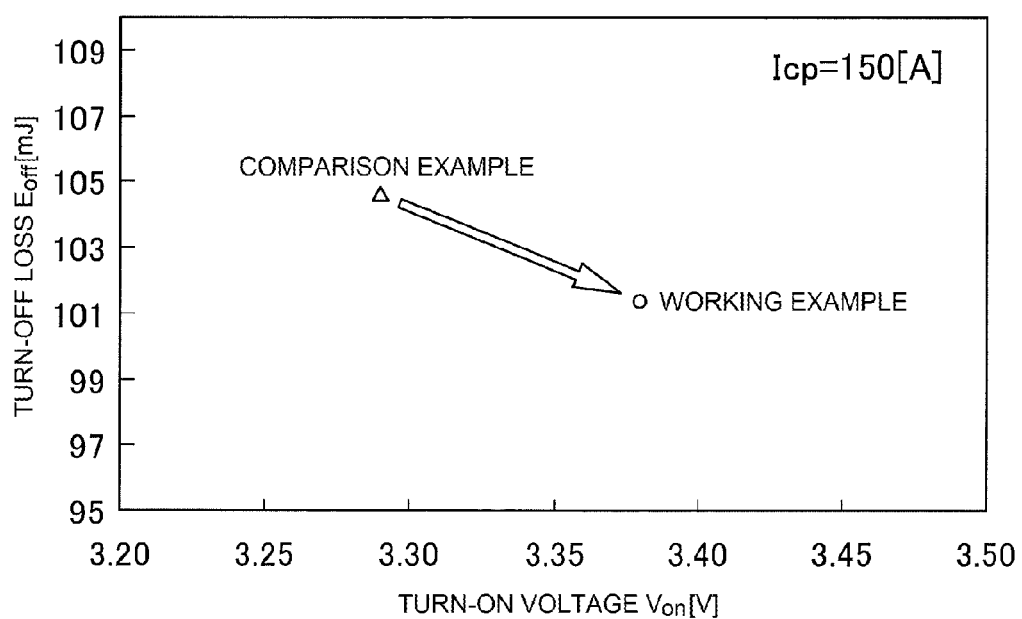
FIG. 12 is a diagram showing a change in the trade-off characteristics between turn-on voltage and turn-off loss.

Next, as shown in FIG. 12, the turn-on voltage $V_{on}$ in the embodiment is about 3.38 [V], and the turn-on voltage $V_{on}$ in the comparison example is about 3.29 [V], when the peak value $I_{cp}$ of the collector current $I_c$ is 150 [A]. The turn-on voltage $V_{on}$ in the embodiment rises by about 0.09 [V] (about 3%) compared with the turn-on voltage $V_{on}$ in the comparison example. Meanwhile, turn-off loss $E_{off}$ in the embodiment is about 101.5 [mJ], and turn-off loss $E_{off}$ in the comparison example is about 104.5 [mJ]. The turn-off loss $E_{off}$ in the embodiment decreases by about 0.09[V] (about 3%) compared with in the comparison example. That is, in the embodiment, disadvantages resulting from the turn-on voltage $V_{on}$ and advantages resulting from the turn-off loss $E_{off}$ being balanced out, the trade-off characteristics substantially do not change, as shown by the outlined arrow in FIG. 12.

Therefore, unlike the comparison example, with the IGBT according to the embodiment wherein the insulating blocks are provided inside the trenches, it is possible to obtain the advantageous effect of reducing only the peak value $I_{gp}$ of the collector current $I_g$ without reducing the turn-on loss $E_{on}$ by adjusting the gate resistance $R_g$ and without lowering the trade-off characteristics between the turn-on voltage $V_{on}$ and the turn-off loss $E_{off}$, as is clear from FIGS. 9 to 12.

Method of Manufacturing IGBT

Figure 13:
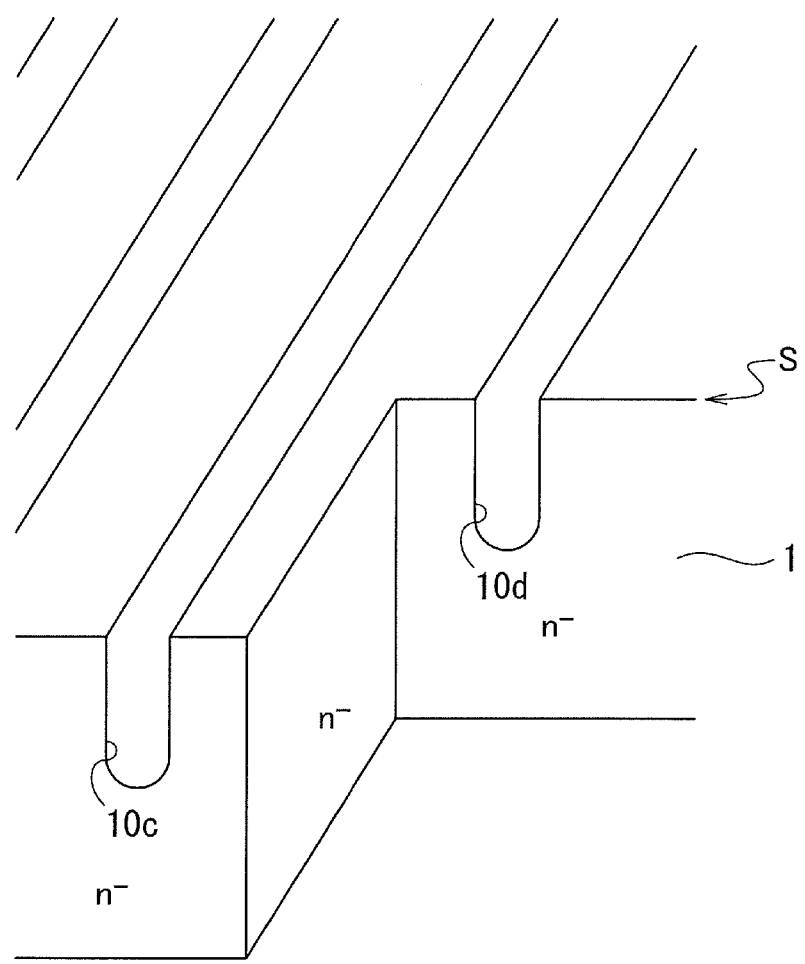
FIG. 13 is a step sectional view schematically illustrating the outline of a method of manufacturing the IGBT according to the embodiment of the invention (1).
Figure 14:
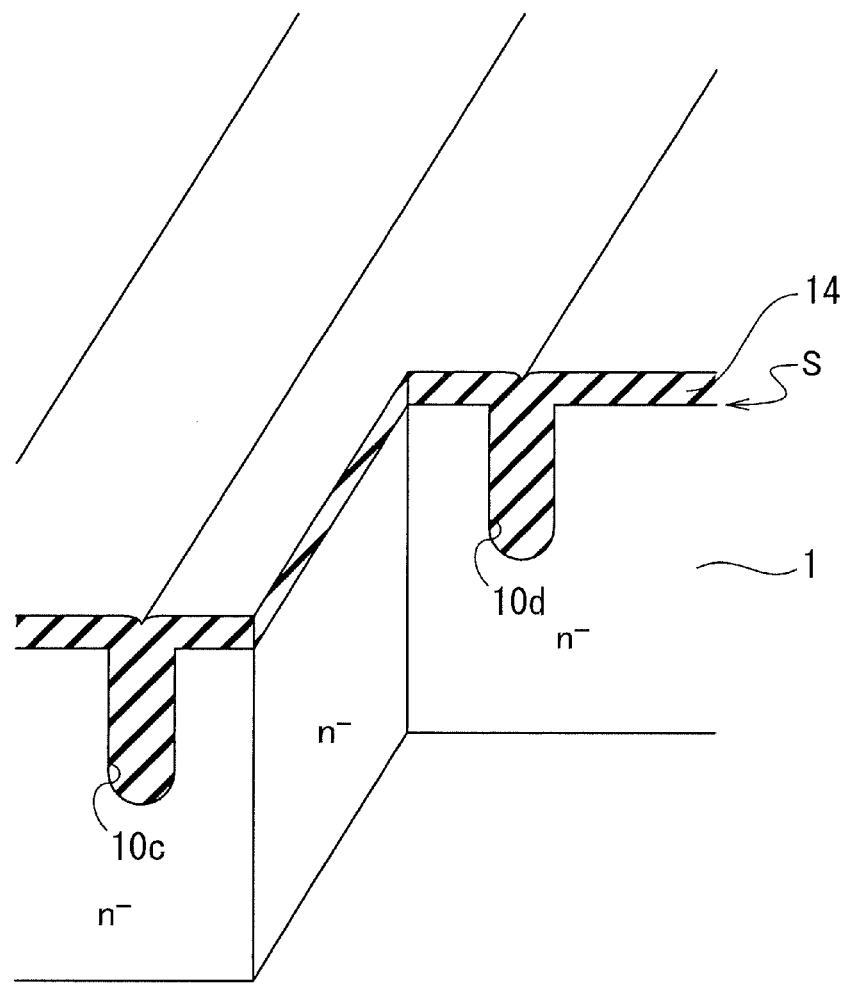
FIG. 14 is a step sectional view schematically illustrating the outline of the method of manufacturing the IGBT according to the embodiment of the invention (2).
Figure 15:
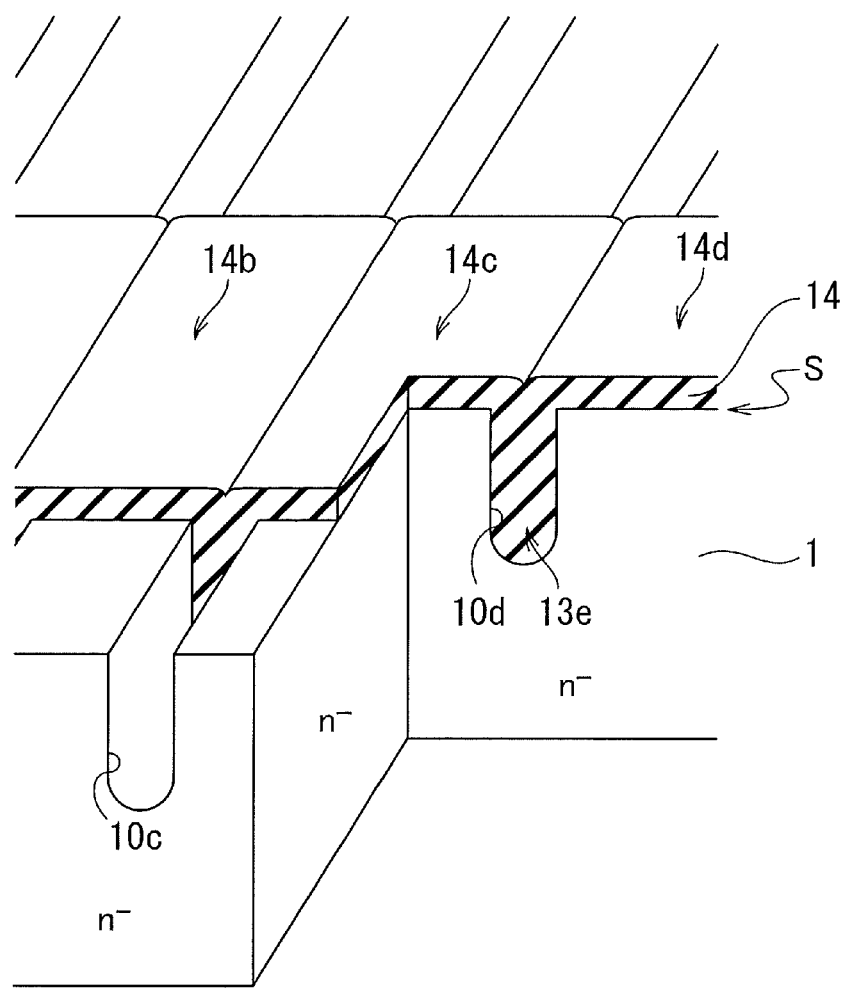
FIG. 15 is a step sectional view schematically illustrating the outline of the method of manufacturing the IGBT according to the embodiment of the invention (3).

Next, a description will be given, referring to FIGS. 13 to 17, of a method of manufacturing the IGBT according to the embodiment of the invention.

a. Firstly, an n-type semiconductor substrate of silicon pulled out, and formed to a predetermined thickness, by, for example, an MCZ (Magnetic field applied Czochralski) method is prepared, and an n-type impurity element, such as phosphorus (P), is doped on one principal surface of the semiconductor substrate at a predetermined concentration by ion implantation or the like, thus forming the first conductivity type drift layer 1. Next, as shown in FIG. 13, a plurality of trenches 10a, 10b, ... 10e, ... of the same width are formed, parallel to each other at equal spaced intervals, in the upper surface of the front surface layer of the first conductivity type drift layer 1 using, for example, a photolithography technology or a dry etching technology.

b. Oxide such as oxide silicon is deposited in advance, as an insulator, all over the upper surface of the front surface layer of the first conductivity type drift layer 1 by a CVD method or the like, thus forming an insulator layer 14, as shown in FIG. 14. At this time, as well as all the inside of each trench 10a, 10b, ... 10e, ... being filled with the insulator, the insulator is deposited so as to be stacked to a position higher than the position of the upper surface S of the first conductivity type drift layer 1, and all the upper surface of the first conductivity type drift layer 1 is covered with the insulator layer 14.

c. Next, the insulator layer 14 is selectively etched using a photolithography technology, a dry etching technology, or the like, and as shown in FIG. 15, one portion of the insulator filling the insides of the trenches is removed, thus selectively exposing one portion of the front surface layer of the first conductivity type drift layer 1 and one portion of the inside of each trench 10a, 10b, ... 10e, .... Specifically, a resist is etched so as to be patterned in a stripe shape perpendicular to the direction of extension of the trenches 10a, 10b, ... 10e, .... By exposing the front surface of the first conductivity type drift layer in the stripe shape, it is possible to efficiently form a plurality of second conductivity type base regions in the subsequent step.

Figure 16:
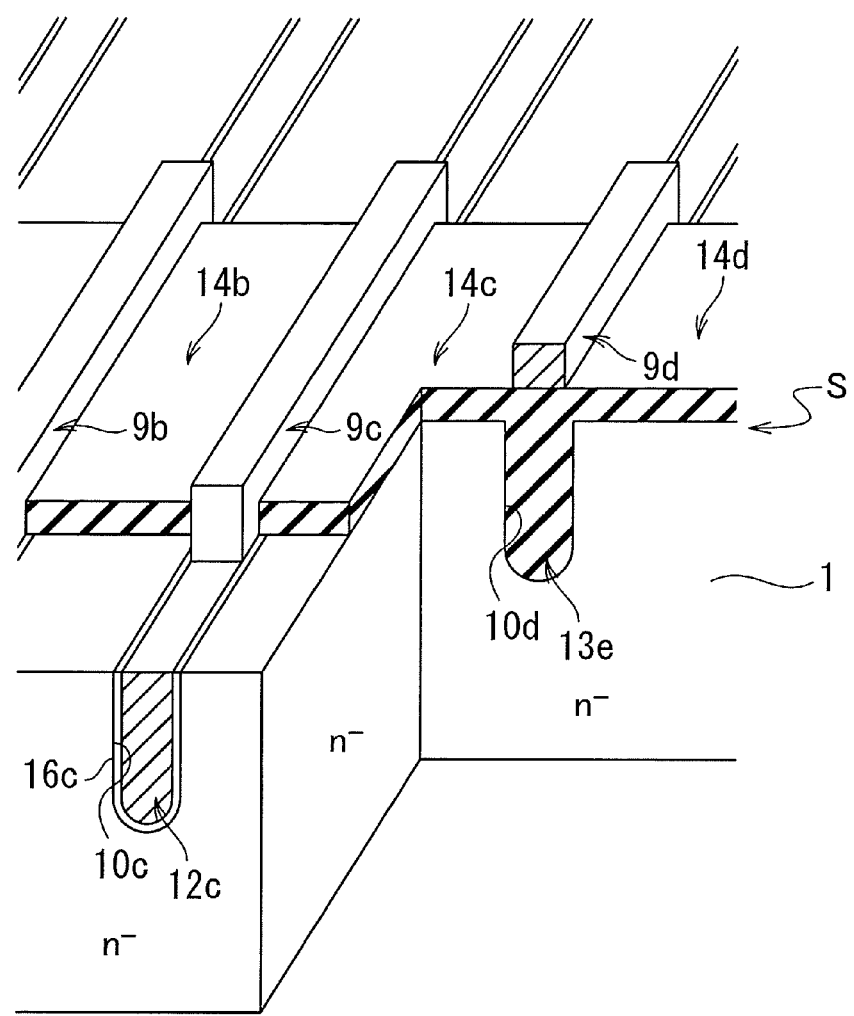
FIG. 16 is a step sectional view schematically illustrating the outline of the method of manufacturing the IGBT according to the embodiment of the invention (4).

Also, the insulating blocks 13a, 13b, ... 13d, ... and the interwall layers 14a, 14b, ... 14d, ... are integrally formed by the insulator layer 14 remaining on the first conductivity type drift layer 1 after the etching. At this time, the insulator layer 14 remaining on the first conductivity type drift layer 1 is patterned so that the length, in the direction of extension of the trenches, of the insulator layer 14 is of a value within a desired range. The patterning is carried out by, for example, adjusting the width of the resist pattern when etching the insulator layer 14. The length of the insulator layer 14 remaining on the first conductivity type drift layer 1 corresponds to the length of the insulating blocks 13a, 13b, . . . 13d, . . . , that is, the distance d between the gate electrodes. For example, when dimensions other than the distance d are set in the same way as the dimensions described in the simulation shown in FIG. 7, a length of on the order of 80 to 100 µm is suitably used as the distance d.

d. Next, the exposed inside surfaces of the trenches 10a, 10b, . . . 10e, . . . are oxidized, and as shown in FIG. 16, an oxide film forming the insulating films 15a, 15b, . . . 15e, . . . and 16a, 16b, . . . 16e, . . . is formed inside the trenches 10a, 10b, . . . 10e, . . . . Further, after a resist appropriate to the width of the oxide film is patterned using a photolithography technology or the like, a doped polysilicon film is stacked using a decompression CVD method or the like. Subsequently, etching is carried out using a dry etching technology or the like, thus forming the gate electrodes 11a, 11b, . . . 11e, . . . and 12a, 12b, . . . 12e, . . . on the exposed insides of the trenches 10a, 10b, . . . 10e, . . . .

Figure 17:
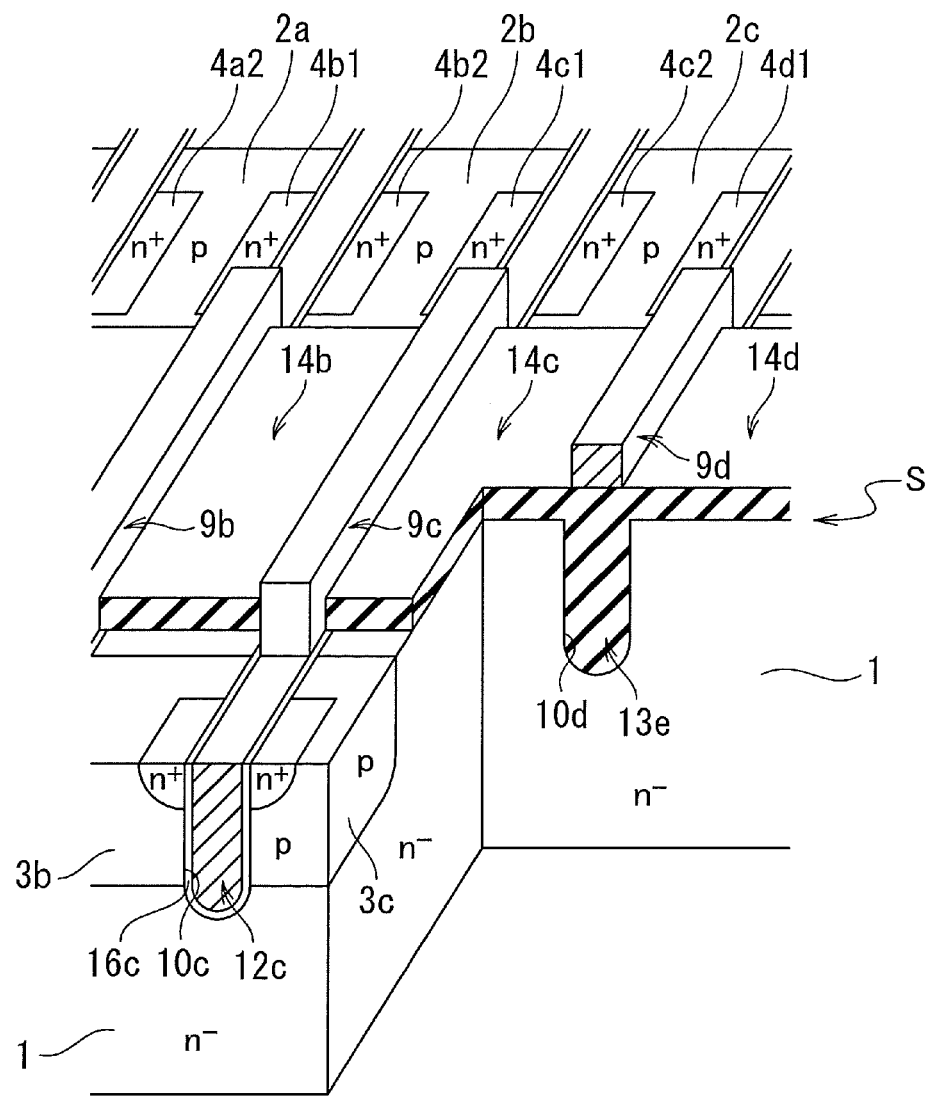
FIG. 17 is a step sectional view schematically illustrating the outline of the method of manufacturing the IGBT according to the embodiment of the invention (5).

At this time, by patterning the doped polysilicon film so that the doped polysilicon film remains on the upper surface of the insulator layer 14 along the trenches 10a, 10b, . . . 10e, . . . , the gate link portions 9a, 9b, . . . 9d, . . . are formed integrally with the gate electrodes 11a, 11b, . . . 11e, . . . and 12a, 12b, . . . 12e, . . . . The gate electrodes 11a, 11b, . . . 11e, . . . and 12a, 12b, . . . 12e, . . . are disposed, separated the distance d from one another, in the respective trenches 10a, 10b, . . . 10e, . . . .

e. Next, a p-type impurity element such as arsenic (As) ions is implanted into the front surface layer of the first conductivity type drift layer 1, from which the insulator layer 14 is removed, using, for example, an ion implantation method, thus forming the second conductivity type base regions 2a, 2b, . . . 2d, . . . and 3a, 3b, . . . 3d, . . . , as shown in FIG. 17.

f. Next, an n-type impurity element such as phosphorus (P) ions is implanted into the respective front surface layers of the formed second conductivity type base regions 2a, 2b, . . . 2d, . . . and 3a, 3b, . . . 3d, . . . by ion implantation or the like, thus forming the first conductivity type emitter regions 4a1, 4a2, 4b1, . . . 4e2, . . . , in the corresponding inner portions of the second conductivity type base regions 2a, 2b, . . . 2d, . . . and 3a, 3b, . . . 3d, . . . .

g. Next, the insulating layer 8 is formed on the second conductivity type base regions 2a, 2b, . . . 2d, . . . and 3a, 3b, . . . 3d, . . . , first conductivity type emitter regions 4a1, 4a2, 4b1, . . . 4e2, . . . , gate electrodes 11a, 11b, . . . 11e, . . . and 12a, 12b, . . . 12e, . . . , and interwall layers 14a, 14b, . . . 14d, . . . by a CVD method or the like (refer to FIG. 1). Further, after a plurality of contact holes C1, C2, . . . (refer to FIG. 1) are formed so as to be open in common in the first conductivity type emitter regions 4a1, 4a2, 4b1, . . . 4e2, . . . and in the second conductivity type base regions 2a, 2b, . . . 2d, . . . and 3a, 3b, . . . 3d, . . . , the emitter electrode 5 is formed on the insulating layer 8 using a film of aluminum (Al), silicon (Si), or the like. Subsequently, a predetermined flattening treatment may be performed, or an unshown passivation film may be formed on the upper surface of the emitter electrode 5.

h. Next, an n-type impurity element such as phosphorus (P) ions is implanted into the lower surface side of the first conductivity type drift layer 1 by ion implantation or the like, thus forming the first conductivity type buffer layer 18 (refer to FIG. 1).

i. Furthermore, a p-type impurity element such as arsenic (As) ions is implanted into the lower surface side of the formed first conductivity type buffer layer 18 by ion implantation or the like, thus forming the second conductivity type collector region 6. When p layers (the second conductivity type base regions 2a, 2b, . . . 2d, . . . and 3a, 3b, . . . 3d, . . . ) are too deep, the first conductivity type buffer layer 18 and the second conductivity type collector layer 6 may be formed before forming the p layers.

j. Subsequently, a metal plate of aluminum (Al), silicon (Si), or the like is joined to the top of the second conductivity type collector region 6 by, for example, an alloy method, thus forming the collector electrode 7. Subsequently, the semiconductor substrate is diced into a plurality of chips, and the chips are mounted on a package by a predetermined processing.

The insulated gate bipolar transistor according to the embodiment of the invention, the gate electrodes are selectively disposed, spaced a distance apart, along the grooves of the trenches, and adjacent gate electrodes are electrically connected by each of the gate link portions stacked on the insulating blocks. Further, the insulating blocks formed by the insides of the trenches being filled with only the insulator are provided, and no gate electrode is disposed, inside the trenches in contact with the carrier accumulation regions of the first conductivity type drift layer. As no gate electrode exists in the vicinity of the carrier accumulation regions, it is possible, even when holes flow into the carrier accumulation regions, to suppress the displacement current flowing to the gate electrodes due to accumulation of the holes. Therefore, it is possible to suppress a sharp rise in the gate voltage and suppress a jump of the collector current when turning on.

The invention has been described using the embodiment disclosed as heretofore described, but it should not be understood that the dissertation and drawings forming one portion of this disclosure limit the invention. It should be conceivable that various substitute embodiments, working examples, and implementation technologies will be obvious to a person skilled in the art from the disclosure. For example, in the embodiment of the invention, a description has been given of an IGBT of an npn transistor type wherein the conductivity modulation effect is produced by holes being accumulated in the carrier accumulation regions, but the invention not being limited to this, an IGBT which is of a pnp transistor type with n and p interchanged and uses electrons as carriers to be accumulated may be configured.

Another Embodiment: First Modification Example

Figure 18:
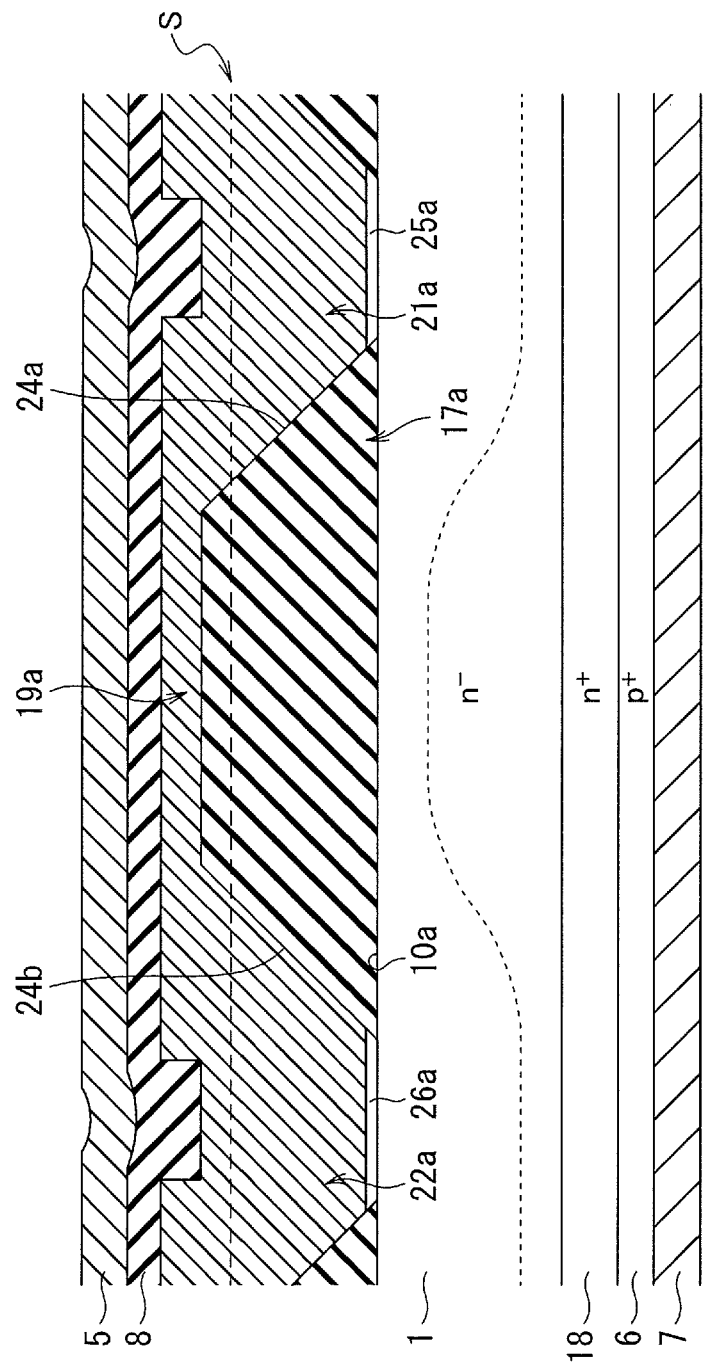
FIG. 18 is a sectional view schematically illustrating an IGBT according to another embodiment of the invention (first modification example).

Also, another embodiment of the invention may be such that as exemplified by an insulating block 17a in FIG. 18, the insulating block 17a is formed so as to expand toward the first conductivity type drift layer 1 side from the insulating layer 8 side. That is, the gate electrodes 21a and 22a adjacent to the insulating block 17a are configured so as to contract toward the first conductivity type drift layer 1 side from the insulating layer 8 side. An inclined surface 24a is formed between the bottom surface of the gate electrode 21a and the bottom surface of a gate link portion 19a, and an inclined surface 24b is formed between the bottom surface of the gate electrode 22a and the bottom surface of the gate link portion 19a.

Herein, when the inclined surfaces 24a and 24b do not exist (refer to FIG. 5), the potential in the boundary regions between the gate electrodes 11a, 11b, . . . 11e, . . . and 12a, 12b, . . . 12e, . . . and the insulating blocks 13a, 13b, . . . 13d, . . . changes abruptly. By the inclined surfaces 24a and 24b being formed, it is possible to moderate the change in the potential in the boundary regions, as shown by the dotted line in the first conductivity type drift layer 1 in FIG. 18, thus improving the breakdown voltage properties of the IGBT. Structures other than the structure described in the first modification example are configured in the same way as the heretofore described configurations of the embodiment of the invention, and the same being applied to other modification examples to be described hereafter, a redundant description will be omitted.

Another Embodiment: Second Modification Example

Figure 19:
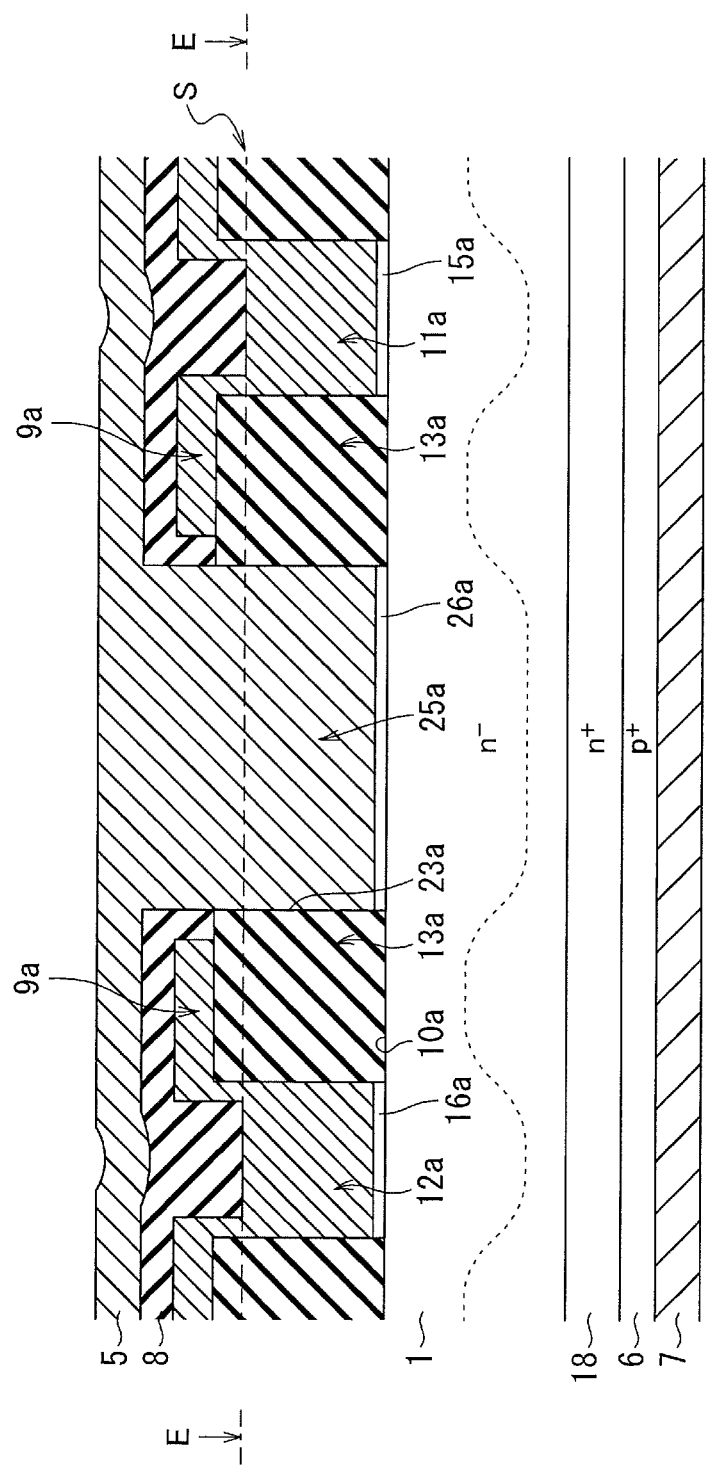
FIG. 19 is a sectional view schematically illustrating an IGBT according to another embodiment of the invention (second modification example).
Figure 20:
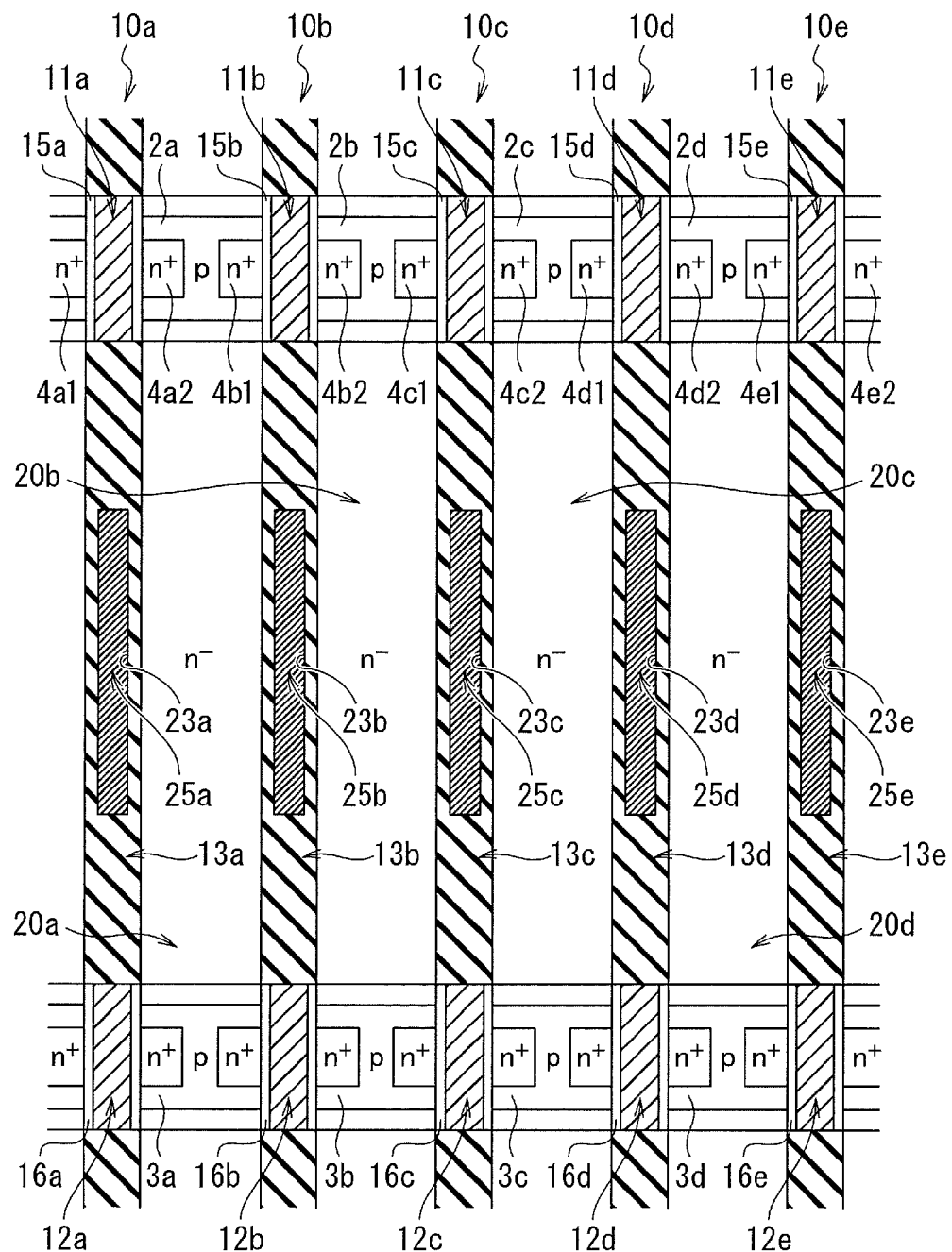
FIG. 20 is a sectional view seen from the E-E direction in FIG. 19.
Figure 21:
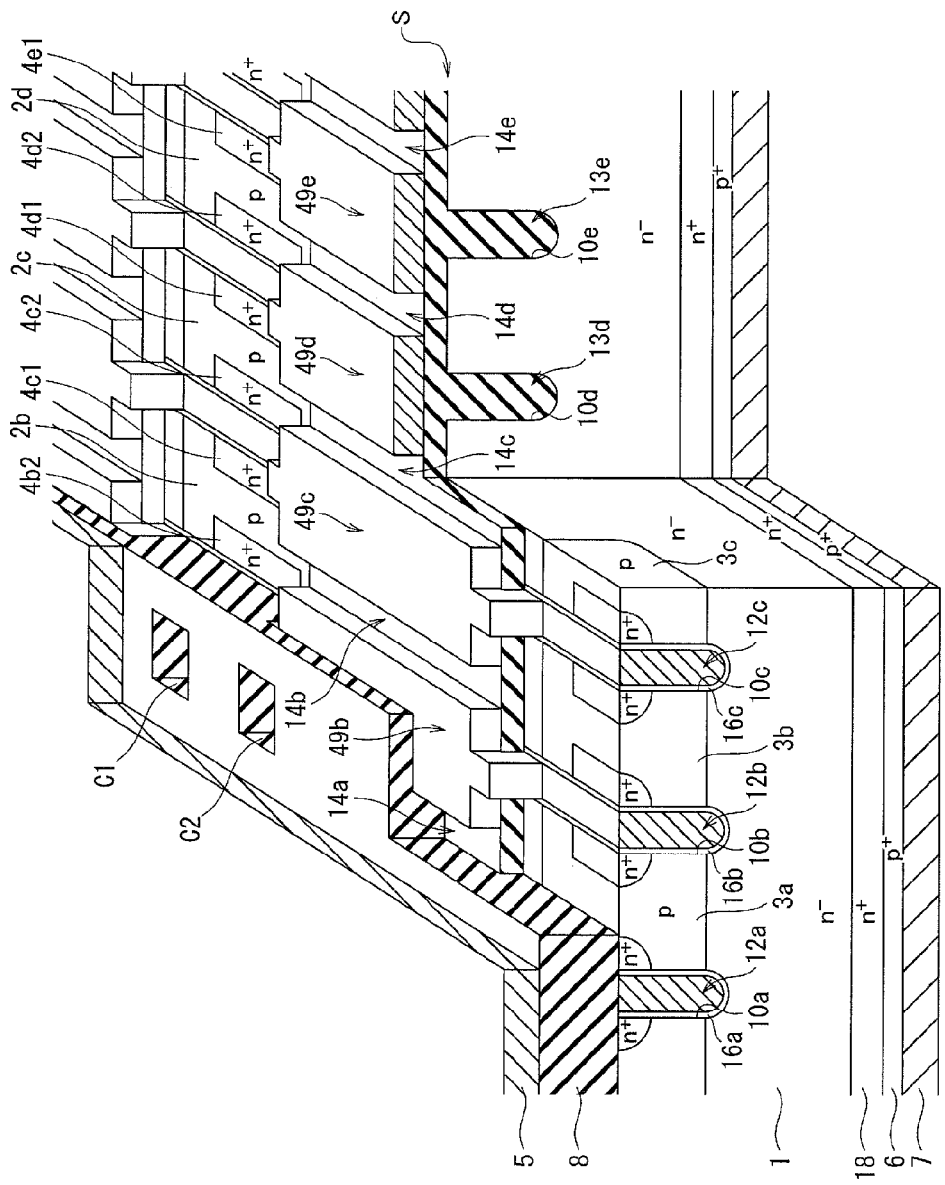
FIG. 21 is a sectional view schematically illustrating an IGBT according to another embodiment of the invention (third modification example).

Also, another embodiment of the invention may be such that a plurality of connection portions 25a, 25b, . . . 25e, . . . , which connect and short-circuit the first conductivity type drift layer 1 and emitter electrode 5, are formed, as shown in FIGS. 19 and 20. FIG. 19 is a diagram showing the condition of a section, perpendicular to the plane, in a central position in the groove width direction of the trench 10a at the left end in FIG. 20.

The connection portions 25a, 25b, . . . 25e, . . . are each formed by doped polysilicon filling the inside of a hole portion 23a formed inside the insulating block 13a so as to pass through the gate link portion 9a, insulating layer 8, and insulating blocks 13a to 13e from the emitter electrode 5 side toward the first conductivity type drift layer 1 side, as shown in FIG. 19. The hole portion 23a is formed so as not to sever the gate link portion 9a by making the width of the hole portion 23a shorter than the width of the gate link portion 9a, as shown in FIG. 20. Also, the connection portions 25a, 25b, . . . 25e, . . . are formed integrally with the emitter electrode 5. The connection portions 25a, 25b, . . . 25e, . . . relax the concentration of electrical field in the first conductivity type drift layer when a reverse bias is applied. That is, the emitter electrode 5 embedded in the connection portions 25a, 25b, . . . 25e, . . . comes close to the first conductivity type drift layer 1 via an insulating films 26a, . . . , and it is thereby possible to moderate a space change in potential, as shown by the dotted line in FIG. 19. By so doing, the effect of improving breakdown voltage is produced.

Another Embodiment: Third Modification Example

Also, another embodiment of the invention may be such that the width of the plurality of gate link portions 49b, 49c, . . . 49e, . . . is formed wider than the width of the gate electrodes 12a, 12b, 12c, . . . . By making the gate link portions 49b, 49c, . . . 49e, . . . greater in width than the gate electrodes 12a, 12b, 12c, . . . , the sectional area of the gate link portions 49b, 49c, . . . 49e, . . . increases. Therefore, as it is possible to configure the gate resistance of the whole of the IGBT to be small, it is possible to suppress a rise in the gate voltage when turning on, and reduce turn-on loss.

Another Embodiment: Fourth Modification Example

Figure 22:
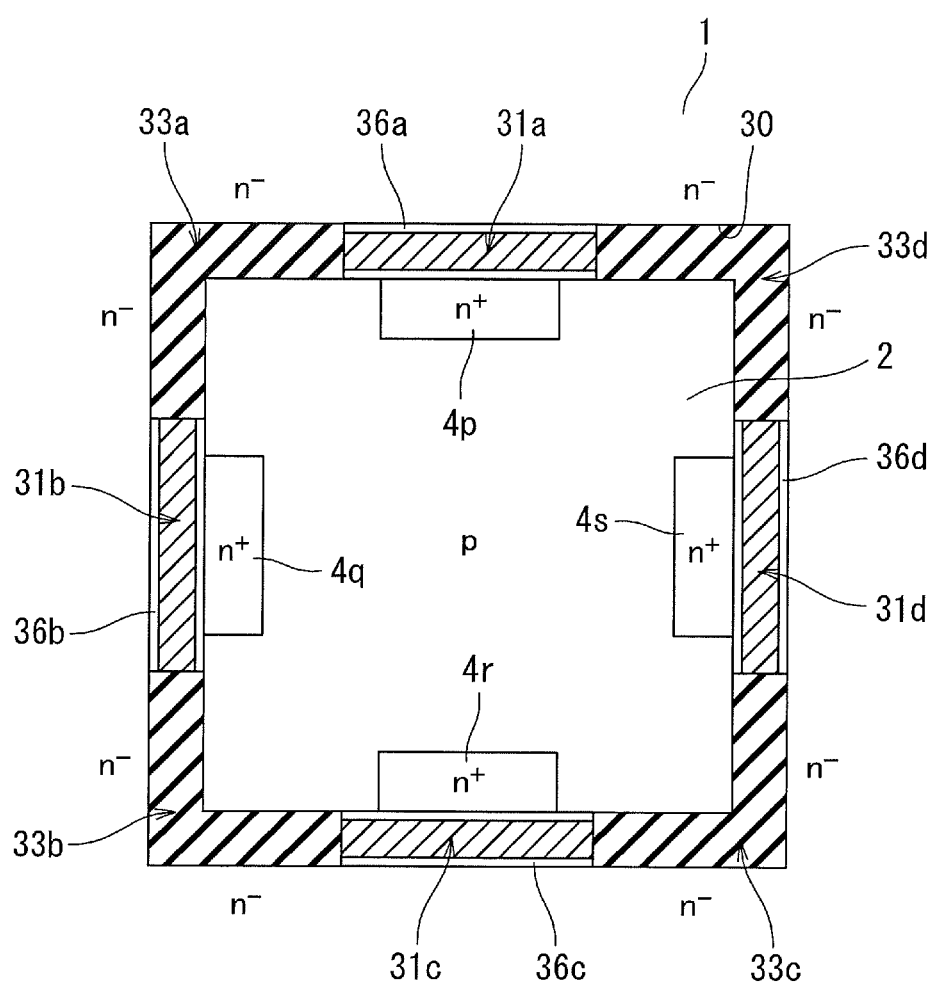
FIG. 22 is a plan view schematically illustrating an IGBT according to another embodiment of the invention (fourth modification example).

Also, another embodiment of the invention may be such that insulating blocks 33a, 33b, 33c, and 33d are formed inside a trench 30, the opening portion of which is represented in a quadrate column shape, with the IGBT viewed in plan, as exemplified in FIG. 22. In FIG. 22, the opening portion of the trench 30, having a substantially square frame shape, is formed on the front surface of an $n^-$-type drift layer 1. A p-type base region 2 is formed inside the square, and furthermore, four $n^+$-type emitter regions 4p, 4q, 4r, and 4s are formed inside the base region 2. Four gate electrodes 31a, 31b, 31c, and 31d are embedded in respective central positions, inside the trench 30, of four sides of the square so as to face the respective four emitter regions 4p, 4q, 4r, and 4s via insulating films 36a, 36b, 36c and 36d. A carrier accumulation region exists, along the frame, outside the trench 30.

The insulating blocks 33a, 33b, 33c, and 33d are formed one between adjacent gate electrodes, that is, in four corner portions of the square, inside the trench 30. The four insulating blocks 33a, 33b, 33c, and 33d are configured from oxide, and the four corner portions are each filled with the oxide. The four gate electrodes 31a, 31b, 31c, and 31d disposed separately inside the trench 30 are connected by unshown wirings. In the case of the IGBT shown in FIG. 22 too, by the four insulating blocks 33a, 33b, 33c, and 33d being formed inside the trench 30 with which the carrier accumulation region is in contact, it is possible to suppress the displacement current flowing to the gate electrodes due to accumulated holes.

As above, the invention includes various embodiments or the like which are not heretofore described, and the technical scope of the invention is fixed from the heretofore description by only the specified matters of the invention according to appropriate claims.

What is claimed is:

1. A trench insulated gate bipolar transistor, comprising:
   trenches formed in a front surface of a first conductivity type drift layer;
   a plurality of gate electrodes selectively provided inside the trenches;
   insulating blocks formed of an insulator, with which insides of the trenches are filled, one between adjacent gate electrodes;
   gate link portions each connecting adjacent gate electrodes; and
   a second conductivity type collector region formed on a surface of the first conductivity type drift layer on an opposite side from the trenches;
   wherein
   the insulating blocks are disposed so as not to overlap with second conductivity type base regions formed in the front surface of the first conductivity type drift layer; and
   wherein the gate electrodes are formed so as to contract toward a second conductivity type collector region side.

2. The trench insulated gate bipolar transistor according to claim 1, further comprising:
   connection portions, which connect the first conductivity type drift layer and an emitter electrode formed on the first conductivity type drift layer, inside respective insulating blocks.

3. The trench insulated gate bipolar transistor according to claim 2, wherein
   the gate link portions are wider in width than the gate electrodes.

4. A trench insulated gate bipolar transistor manufacturing method, comprising:

forming trenches in a front surface of a first conductivity type drift layer;
selectively providing a plurality of gate electrodes, formed so as to contract toward a second conductivity type collector region side, inside the trenches;
filling insides of the trenches, one between adjacent gate electrodes, with insulating blocks formed from an insulator;
connecting adjacent gate electrodes with gate link portions; and
forming a second conductivity type collector region on a surface of the first conductivity type drift layer on an opposite side from the trenches;
wherein
the filling the insides of the trenches includes disposing the insulating blocks so as not to overlap with second conductivity type base regions formed in the front surface of the first conductivity type drift layer.

5. A semiconductor device, comprising:
a semiconductor substrate;
a plurality of trenches formed in the semiconductor substrate;
a plurality of gates formed in each of the plurality of trenches, a gate in a respective trench being separated from another gate in the respective trench;
an insulator formed in each of the plurality of trenches between separated gates;
connector structures connecting the separated gates; and
an insulating layer formed on the plurality of gates, the connector structures and a layer of the insulator above the plurality of trenches;
wherein a portion of a connector structure extends along the layer of the insulator above the plurality of trenches.

\* \* \* \* \*